US011269262B2

(12) United States Patent
Butler et al.

(10) Patent No.: US 11,269,262 B2
(45) Date of Patent: Mar. 8, 2022

(54) FRAME ASSEMBLY, LITHOGRAPHIC APPARATUS AND DEVICE MANUFACTURING METHOD

(71) Applicant: ASML Netherlands B.V., Veldhoven (NL)

(72) Inventors: Hans Butler, Best (NL); Joep Sander De Beer, Oss (NL); Cornelius Adrianus Lambertus De Hoon, Eindhoven (NL); Jeroen Pieter Starreveld, Knegsel (NL); Martinus Van Duijnhoven, Deurne (NL); Maurice Willem Jozef Etiënne Wijckmans, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/049,719

(22) PCT Filed: Apr. 4, 2019

(86) PCT No.: PCT/EP2019/058504
§ 371 (c)(1),
(2) Date: Oct. 22, 2020

(87) PCT Pub. No.: WO2019/206595
PCT Pub. Date: Oct. 31, 2019

(65) Prior Publication Data
US 2021/0240090 A1 Aug. 5, 2021

(30) Foreign Application Priority Data
Apr. 25, 2018 (EP) .................................... 18169261

(51) Int. Cl.
G03F 7/20 (2006.01)

(52) U.S. Cl.
CPC ...... *G03F 7/70808* (2013.01); *G03F 7/70716* (2013.01); *G03F 7/70775* (2013.01); *G03F 7/709* (2013.01)

(58) Field of Classification Search
CPC .. G03F 7/70833; G03F 7/708; G03F 7/70808; G03F 7/70816; G03F 7/709
See application file for complete search history.

(56) References Cited

U.S. PATENT DOCUMENTS 4,730,541 A 3/1988 Greene
4,821,191 A 4/1989 Ikemoto et al.
(Continued)

FOREIGN PATENT DOCUMENTS

DE 37 18 630 A1 12/1987
EP 1 486 825 A1 12/2004
(Continued)

OTHER PUBLICATIONS

International Search Report and Written Opinion of the International Searching Authority directed to related International Patent Application No. PCT/EP2019/058504, dated Jul. 23, 2019; 11 pages.
(Continued)

Primary Examiner — Steven Whitesell Gordon
(74) Attorney, Agent, or Firm — Sterne, Kessler, Goldstein & Fox P.L.L.C.

(57) ABSTRACT

A lithographic apparatus or frame assembly, comprising: a first and second pneumatic support, being arranged to control position of a frame, each of said pneumatic supports accommodating a pressure chamber; a frame position control system, comprising; a first position sensor device, configured to generate measurement data relating to the position of the frame; a first pressure controller, configured to control the pressure in the pressure chamber of the first
(Continued)

pneumatic support on the basis of the measurement data generated by the first position sensor device; a pressure differential sensor device, configured to generate data relating to the difference between the pressure in the pressure chambers of the first and the second pneumatic support; a second pressure controller, configured to control the pressure in the pressure chamber of the second pneumatic support on the basis of the measurement data from the pressure differential sensor device.

20 Claims, 9 Drawing Sheets

(56) References Cited

U.S. PATENT DOCUMENTS

| | | |
|---|---|---|
| 5,379,980 A | 1/1995 | Houghton, Jr. et al. |
| 6,020,964 A | 2/2000 | Loopstra et al. |
| 6,170,622 B1 | 1/2001 | Wakui et al. |
| 6,952,253 B2 | 10/2005 | Lof et al. |
| 2003/0043357 A1 | 3/2003 | Shimoda |
| 2007/0058173 A1 | 3/2007 | Holzapfel |
| 2009/0224444 A1 | 9/2009 | Mayama et al. |

FOREIGN PATENT DOCUMENTS

| | | |
|---|---|---|
| JP | H 11141599 A | 5/1999 |
| JP | 2000-081079 A | 3/2000 |
| JP | 2001-345256 A | 12/2001 |
| WO | WO 2017/148650 A1 | 9/2017 |
| WO | WO 2018/015079 A1 | 1/2018 |

OTHER PUBLICATIONS

International Preliminary Report on Patentability directed to related International Patent Application No. PCT/EP2019/058504, dated Oct. 27, 2020; 8 pages.

FRAME ASSEMBLY, LITHOGRAPHIC APPARATUS AND DEVICE MANUFACTURING METHOD

CROSS-REFERENCE TO RELATED APPLICATION

This application claims priority of EP application 18169261.7 which was filed on Apr. 25, 2018 and which is incorporated herein in its entirety by reference.

FIELD

The present invention relates to a frame assembly and a lithographic projection apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Lithographic apparatuses contain a frame or frame assembly of which the deformation has to be limited in order to make it possible to achieve the desired accuracy of the pattern on the wafer. Ideally, such a frame or frame assembly is supported on three supports, e.g. pneumatic supports such as air mounts, in order to obtain a statically determined support for the frame. However, due to layout considerations relating to components within the lithographic apparatus, this is not always possible. Therefore, sometimes one or more of the frames have to be supported on four supports instead of on three.

When four supports are used, deformation of the frame or frame assembly may occur.

SUMMARY

It is desirable to provide a frame assembly as can e.g. be used in a lithographic apparatus, a lithographic apparatus and a lithographic projection apparatus in which deformation of frames which are supported on four supports is reduced.

According to an embodiment of the invention, a lithographic apparatus is provided which comprises:
a frame,
a first and a second pneumatic support, these pneumatic supports being arranged to control a position of the frame relative to a reference,
the first pneumatic support being connected to the frame at a first support location, the second pneumatic support being connected to the frame at a second support location, each of said pneumatic supports accommodating a pressure chamber,
a frame position control system, which frame position control system comprises:
a first position sensor device, which is configured to generate measurement data relating to the position of the frame,
a first pressure controller, which is configured to control a pressure in the pressure chamber of the first pneumatic support on the basis of the measurement data generated by the first position sensor device,
a pressure differential sensor device, which is configured to generate data relating to a difference between the pressure in the pressure chamber of the first pneumatic support and a pressure in the pressure chamber of the second pneumatic support,
a second pressure controller, which is configured to control the pressure the pressure chamber of the second pneumatic support on the basis of the measurement data generated by the pressure differential sensor device.

According to an embodiment, a frame assembly is provided, comprising:
a frame,
a first and a second pneumatic support, these pneumatic supports being arranged to control a position of the frame relative to a reference,
the first pneumatic support being connected to the frame at a first support location, the second pneumatic support being connected to the frame at a second support location, each of said pneumatic supports accommodating a pressure chamber,
a frame position control system, which frame position control system comprises:
a first position sensor device, which is configured to generate measurement data relating to the position of the frame,
a first pressure controller, which is configured to control a pressure in the pressure chamber of the first pneumatic support on the basis of the measurement data generated by the first position sensor device,
a pressure differential sensor device, which is configured to generate data relating to a difference between the pressure in the pressure chamber of the first pneumatic support and a pressure in the pressure chamber of the second pneumatic support,
a second pressure controller, which is configured to control the pressure in the pressure chamber of the second pneumatic support on the basis of the measurement data generated by the pressure differential sensor device.

In these embodiments, a first pneumatic support is controlled on the basis of a measured position of the frame. The second pneumatic support is controlled on the basis of the difference between the pressure in the pressure chamber of the first pneumatic support and the pressure in the pressure chamber of the second pneumatic support. This eliminates the necessity for a significant gas flow between the first and the second pneumatic support. It is known from the prior art to connect the pressure chambers of the first and the second pneumatic support to each other by a gas conduit so that they more or less act as a single support. This gas conduit however has to be relatively large, and a significant gas flow may occur in both directions (i.e. from the first to the second pneumatic support and vice versa). There is little room in a lithographic apparatus to accommodate this gas conduit, and in addition, it acoustic effects (e.g. Helmholz resonances) may occur which can cause vibration problems. The current embodiment of the invention therefore provides more design freedom and reduces or eliminates problems with acoustic effects in such a conduit, such as Helmholtz resonances.

In an embodiment of the lithographic apparatus or the frame assembly according to the invention, the second pressure controller is configured to control the pressure in the pressure chamber of the second pneumatic support in such way that the difference between the pressure in the pressure chamber of the first pneumatic support and the pressure in the pressure chamber of the second pneumatic support is brought below a threshold value, e.g. brought to zero. This way, the force exerted onto the frame by the first pneumatic support 20 and the force exerted onto the frame by the second pneumatic support 30 are linked to each other. This allows to control the torque which is exerted onto the frame by the first and second pneumatic supports 20,30, or to reduce this torque to zero.

In an embodiment of the lithographic apparatus or the frame assembly according to the invention, the first and second pneumatic supports are configured to control a vertical position of the frame relative to the reference. Pneumatic supports are advantageous to use for vertical support of the frame, as they are able to bear the weight of the frame, provide position control of the frame and provide vibration damping.

In an embodiment of the lithographic apparatus or the frame assembly according to the invention, the first position sensor device is configured to generate measurement data relating to the position of the first and/or second support location of the frame. This way, the control of the pneumatic supports is directly related to the local deformation of the frame at or close to at least one support location on the frame, which improves the accuracy of the system.

In an embodiment of the lithographic apparatus or the frame assembly according to the invention, the lithographic apparatus further comprises a third pneumatic support and a fourth pneumatic support, the third pneumatic support being connected to the frame at a third support location, the fourth pneumatic support being connected to the frame at a fourth support location. Each of said third and fourth pneumatic supports accommodates a pressure chamber.

Optionally, in this embodiment, the frame position control system further comprises:
- a third position sensor device, which is configured to generate measurement data relating to the position of the third support location of the frame,
- a third pressure controller, which is configured to control a pressure in the pressure chamber of the third pneumatic support on the basis of the measurement data generated by the third position sensor device,
- a fourth position sensor device, which is configured to generate measurement data relating to the position of the fourth support location of the frame,
- a fourth pressure controller, which is configured to control a pressure in the pressure chamber of the fourth pneumatic support on the basis of the measurement data generated by the third position sensor device.

In this embodiment, three of the four pneumatic supports are controlled directly. The other one of the four pneumatic supports follows one of the directly controlled pneumatic supports.

In an embodiment of the lithographic apparatus or the frame assembly according to the invention, the frame is a frame of the projection system, e.g. a force frame of the projection system, or a frame of an illumination system, or a wafer stage metrology frame.

In an embodiment of the lithographic apparatus or the frame assembly according to the invention, the reference is a base frame, or the floor onto which the lithographic apparatus is installed, or a pedestal onto which the lithographic apparatus is arranged.

According to a further embodiment of the invention, a lithographic apparatus or a frame assembly is provided which comprises:
- a first frame,
- a first frame support comprising a first pneumatic support comprising an actuator, said first pneumatic support being arranged to control a position of the first frame relative to a first frame reference, said first pneumatic support being connected to the first frame at a first support location,
- a second frame, which second frame is different from the first frame reference, the second frame being supported on the first frame by a second frame support,
- a second frame position measurement system, which is configured to generate measurement data relating to a position of the second frame relative to the first frame,
- a first frame position control system, which is configured to receive said measurement data generated by the second frame position measurement system, and to control the actuator of the first pneumatic support on the basis of said measurement data.

In this embodiment, the position of the second frame is determined in order to control the pneumatic supports supporting the first frame. This is in particular advantageous if the second frame is already equipped with a position measurement system for other reasons. In that case, no additional sensors have to be installed.

In an embodiment of the lithographic apparatus or the frame assembly according to the invention, the first frame support further comprises:
- a second pneumatic support which is connected to the first frame at a second support location,
- a third pneumatic support which connected to the first frame at a third support location, and
- a fourth pneumatic support which is connected to the first frame at a fourth support location,
- each of said pneumatic supports comprising an actuator.

In this embodiment, four pneumatic supports are used to support the first frame.

Optionally, in this embodiment of the lithographic apparatus or the frame assembly according to the invention, the second frame position measurement system is configured to generate measurement data relating to the position of a first location, a second location, a third location and a fourth location of the second frame relative to the first frame, and wherein the second frame position measurement system comprises a processing system to generate a control system on the basis of at least a part of said measurement data.

In this embodiment, the local deformation of the first frame can be directly counteracted by the pneumatic supports.

In an embodiment of the lithographic apparatus according to the invention, the first frame is a force frame, e.g. a projection system force frame, or a wafer stage metrology frame.

In an embodiment of the lithographic apparatus according to the invention, the second frame is a sensor frame, e.g. a projection system sensor frame, or a wafer stage metrology frame.

In an embodiment of the lithographic apparatus according to the invention, the first frame reference is a base frame, or a floor onto which the lithographic apparatus is arranged, or a pedestal onto which the lithographic apparatus is arranged.

According to a further embodiment of the invention, a lithographic apparatus or frame assembly is provided comprising:
  a first frame,
  a first frame support comprising a first pneumatic support comprising an actuator and a pressure chamber, said first pneumatic support being arranged to control a position of the first frame relative to a first frame reference, said first pneumatic support being connected to the first frame at a first support location, the first frame support further comprising a second pneumatic support, the second pneumatic support being connected to the frame at a second support location, the second pneumatic support accommodating a pressure chamber,
  a second frame, which second frame is different from the first frame reference, the second frame being supported on the first frame by a second frame support,
  a second frame position measurement system, which is configured to generate measurement data relating to a position of the second frame relative to the first frame,
  a first frame position control system, which is configured to receive said measurement data generated by the second frame position measurement system, and to control the actuator of the first pneumatic support on the basis of said measurement data, and
  wherein the first frame position control system further comprises:
    a pressure differential sensor device, which is configured to generate data relating to a difference between a pressure in the pressure chamber of the first pneumatic support and a pressure in the pressure chamber of the second pneumatic support,
    a second pressure controller, which is configured to control the pressure in the pressure chamber of the second pneumatic support on the basis of the measurement data generated by the pressure differential sensor device.

According to a further embodiment of the invention, a lithographic apparatus or frame assembly is provided comprising:
  a first frame,
  a first frame support comprising a first and a second pneumatic support, these pneumatic supports being arranged to control a position of the frame relative to a first frame reference,
  the first pneumatic support being connected to the frame at a first support location, the second pneumatic support being connected to the frame at a second support location, each of said pneumatic supports accommodating a pressure chamber,
  a second frame, which second frame is different from the first frame reference, the second frame being supported on the first frame by a second frame support,
  a second frame position measurement system, which is configured to generate measurement data relating to a position of the second frame relative to the first frame,
  a first frame position control system, which is configured to receive said measurement data generated by the second frame position measurement system, which frame position control system comprises:
    a first pressure controller, which is configured to control a pressure in the pressure chamber of the first pneumatic support on the basis of the measurement data generated by the second frame position measurement system,
    a pressure differential sensor device, which is configured to generate data relating to a difference between the pressure in the pressure chamber of the first pneumatic support and a pressure in the pressure chamber of the second pneumatic support,
    a second pressure controller, which is configured to control the pressure in the pressure chamber of the second pneumatic support on the basis of the measurement data generated by the pressure differential sensor device and/or on the basis of measurement data generated by the second frame position measurement system.

According to a further embodiment of the invention a device manufacturing method is provided, comprising transferring a pattern from a patterning device onto a substrate, comprising the step of using a lithographic apparatus according to the invention

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
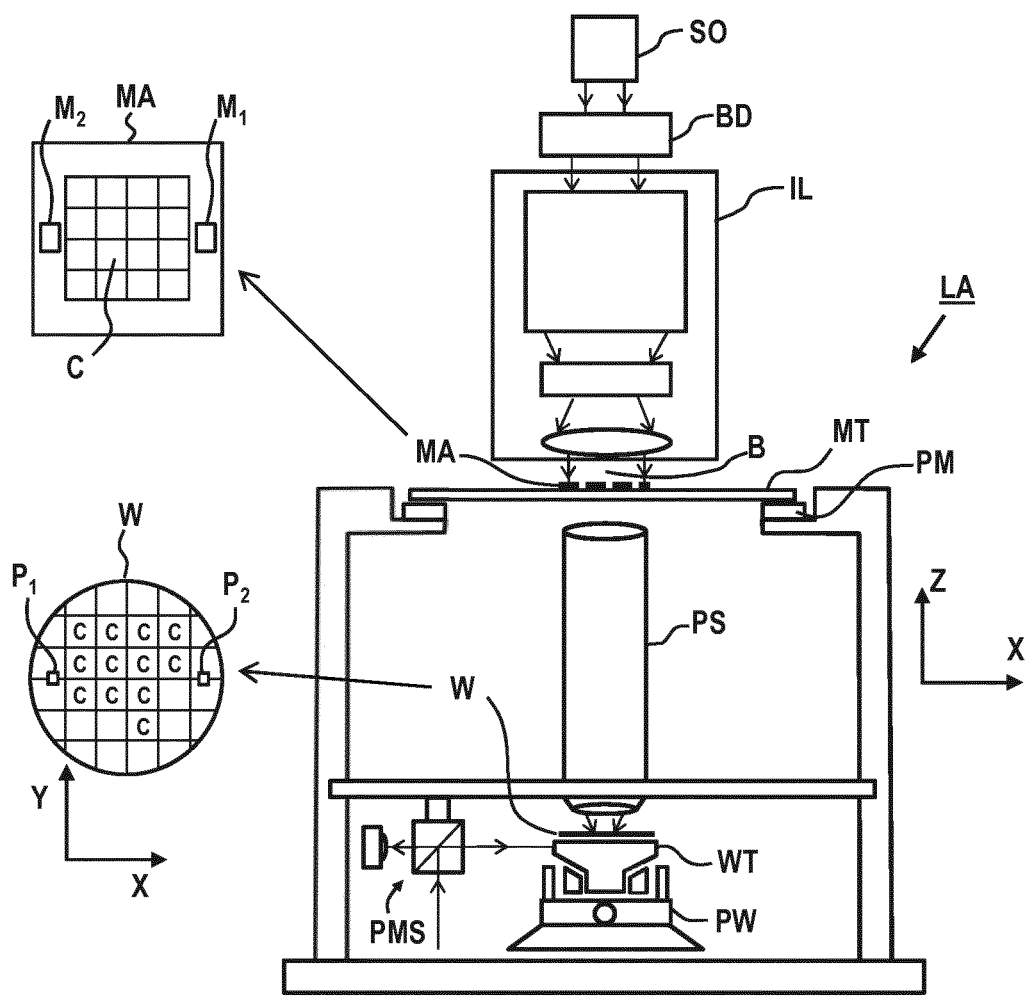
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
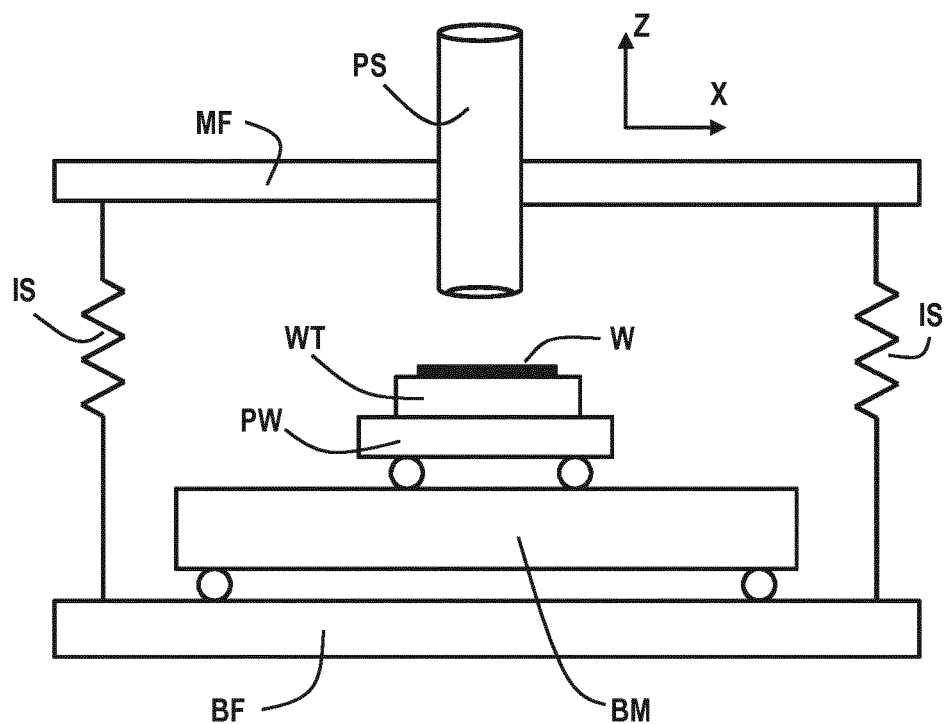
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

In an alternative arrangement, the projection system PS is supported onto the base frame BF by a dedicated vibration isolation system IS. In such an embodiment, a force frame may be provided which supports at least a part of the projection system PS and/or at least a part of the illumination system IL. In addition, a sensor frame may be provided which comprises at least a part of a position measurement system which is arranged to measure the position of the projection system PS or a part thereof, and/or of the illumination system IL or a part thereof.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
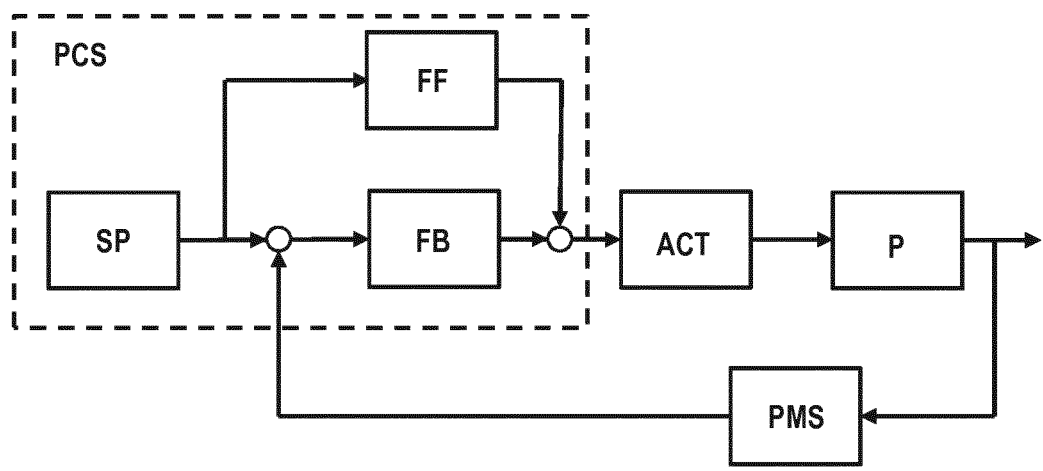
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
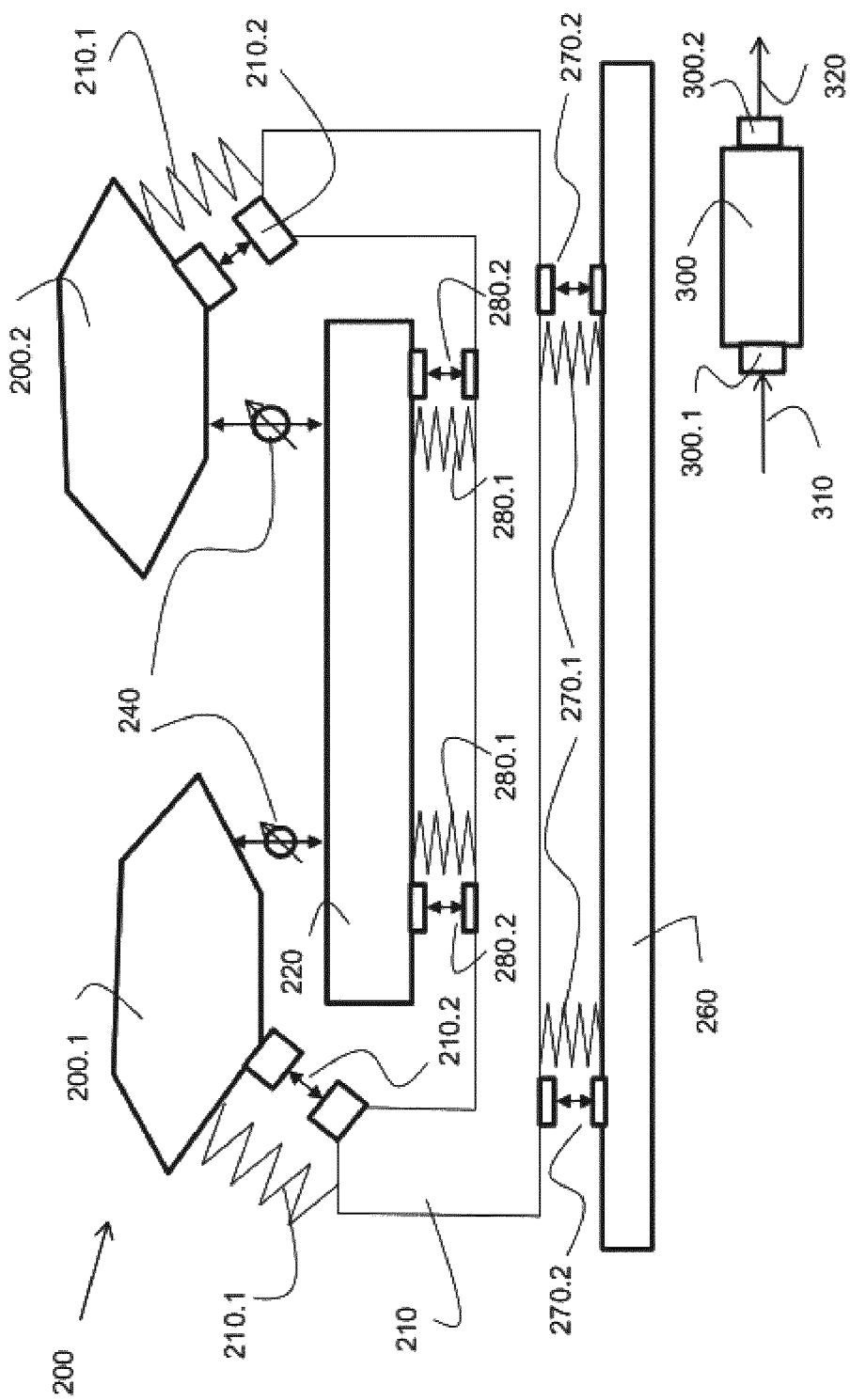
FIG. 4 depicts a schematic representation of a part of a first embodiment of a lithographic apparatus in which the invention can be applied.

FIG. 4 schematically depicts part of a part of a lithographic apparatus in which an embodiment of the invention can be applied. FIG. 4 schematically shows a projection system 200 including two optical elements 200.1 and 200.2. FIG. 4 further shows a force frame 210 configured to support the optical elements 200.1, 200.2. Such a support may e.g. be realized using one or more vibration isolators 210.1 and/or actuators 210.2. In the embodiment as shown, the lithographic apparatus further comprises a sensor frame 220 configured to support a measurement system, e.g. the position measurement system 240. In the embodiment as shown, the lithographic apparatus further comprises a position measurement system 240 for measuring a position of the optical elements 200.1, 200.2 relative to the sensor frame 220. In the embodiment as shown, the force frame 210 is mounted to the base frame 260 of the apparatus, by means of vibration isolators 270.1 and/or actuators 270.2. Further, as can be seen, the sensor frame 220 is mounted, by means of vibration isolators 280.1 and/or actuators 280.2 to the force frame 210.

Figure 5:
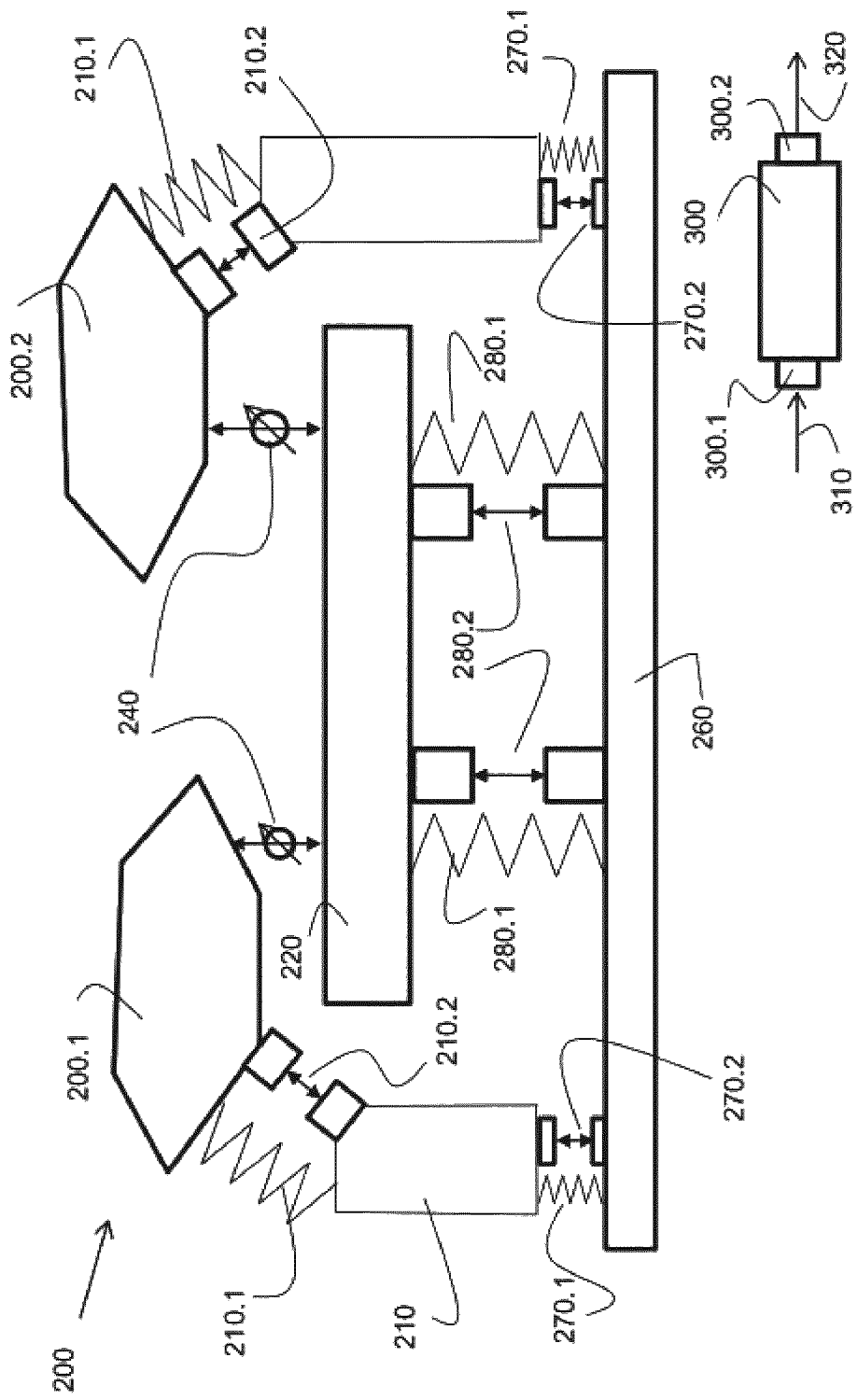
FIG. 5 depicts a schematic representation of a part of a second embodiment of a lithographic apparatus in which the invention can be applied.

In the embodiment of the invention as shown in FIG. 4, the sensor frame 220 is supported, by means of vibration isolators 280, on the force frame 210. It can be pointed out that alternative arrangements may be considered as well. A further embodiment of the invention with such an alternative arrangement is schematically shown in FIG. 5. As shown in FIG. 5, the sensor frame 220 may be mounted to the base frame 260, in a similar manner as the force frame 210 is mounted to the base frame 260.

As such, in an embodiment of the invention, the lithographic apparatus comprises a control unit 300 configured to control an operating parameter or state of the apparatus. Such a control unit 300 may e.g. be embodied as a controller, microprocessor, computer or the like. In the embodiment as shown, the control unit 300 comprises an input terminal 300.1 for receiving input signals 310. In an embodiment, the input terminal 300.1 may e.g. be configured to receive measurement signals representative for the state of the base frame, whereby the control unit 300 may be configured to determine, based on the measurement signals as received, a position of the force frame 210 and/or sensor frame 220 and/or optical elements 200.1, 200.2 of the projection system 200. Based on this positional information, the control unit may e.g. generate a control signal and output this control signal 320 via an output terminal 300.2 of the control unit 300. Such a control signal 320 may e.g. be a control signal for controlling an operation of the actuators 270.2 and/or actuators 280.2 and/or actuators 210.2, thereby controlling a position of the force frame 210, sensor frame 220 and optical elements 200.1, 200.2, respectively.

Further as shown, a displacement of the optical elements 200.1 and/or 200.2 relative to the sensor frame 220 can be monitored, by means of the position measurement system 240. Such a position measurement system may e.g. comprise an interferometer based measurement system or an encoder based measurement system. Capacitive or inductive measurement system may be considered as well.

Alternatively, or in addition, the control unit 300 as applied in the embodiment of the present invention may be configured to receive the position measurement signals of the position measurement systems 240, whereby the control unit 300 may be configured to determine, based on the measurement signals as received, a position of the optical elements 200.1, 200.2 of the projection system 200. Based on this positional information, the control unit may e.g. generate a control signal and output this control signal 320 via an output terminal 300.2 of the control unit 300. Such a control signal 320 may e.g. be a control signal for controlling an operation of the actuators 210.2, thereby controlling a position of the optical elements 200.1, 200.2.

As a further alternative, or addition, the control unit 300 as applied in the embodiment of the present invention may be configured to determine a control signal for controlling a positioning of a substrate in the lithographic apparatus, in particular a positioning of the substrate relative to a patterned radiation beam that is projected onto the substrate via the projection system 200. By doing so, a displacement of the patterned radiation beam due to a displacement of the one or more of the optical elements of the projection system 200 may be corrected for.

The current invention pertains to a lithographic apparatus which contains at least one frame of which the deformation has to be limited. Such a frame can for example be the force frame. This frame is supported by multiple supports, of which at least two are pneumatic supports, e.g. airmounts.

Figure 6:
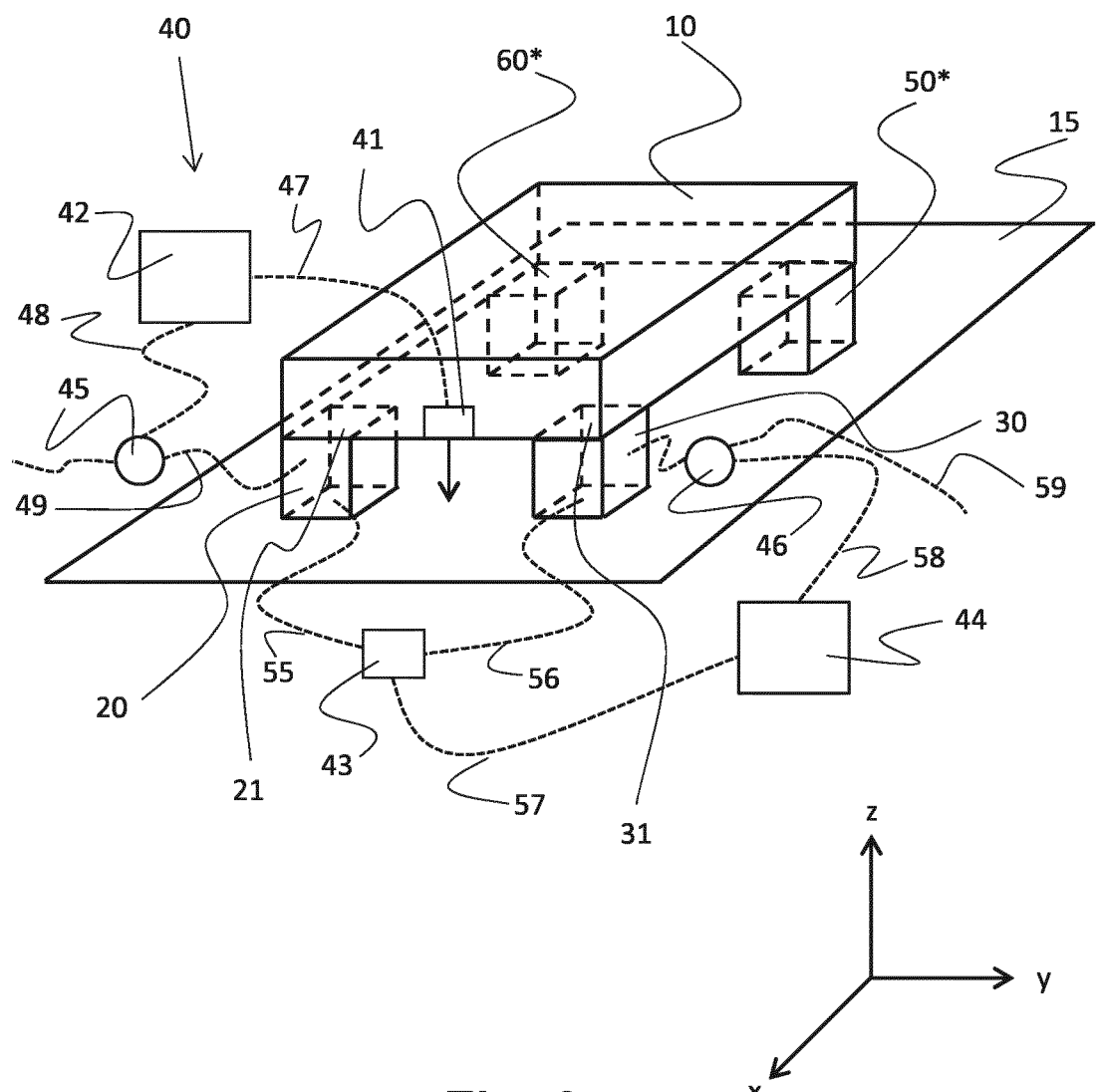
FIG. 6 depicts a schematic representation of a first embodiment of the invention.

FIG. 6 shows a schematic representation of a first embodiment of the invention. In this embodiment, a frame assembly is schematically shown. Such a frame assembly may e.g. be implemented in a lithographic apparatus such as lithographic apparatus LA. The frame assembly as shown may thus also be considered part of a lithographic apparatus according to the invention. The frame assembly as shown comprises a frame 10. The frame 10 is supported by a first pneumatic support 20 and a second pneumatic support 30. The first and second pneumatic supports 20, 30 are arranged to control a position of the frame 10 relative to a reference 15. The reference 15 may for example be the base frame BF. In the embodiment of FIG. 6, the first and second pneumatic supports 20, 30 are configured to control a vertical position of the frame 10 relative to the reference 15. Preferably, the pneumatic supports 20, 30 each bear a part of the weight of the frame 10.

The first pneumatic support 20 is connected to the frame 10 at a first support location 21. The second pneumatic support 30 is connected to the frame 10 at a second support location 31. Each of said pneumatic supports 20, 30 accommodates a pressure chamber.

Optionally in this embodiment, each pneumatic support 20, 30 accommodates a moveable piston. The pressure chamber is partly delimited by said moveable piston. The pressure chamber is suitable for accommodating pressurized gas, and the position of the moveable piston within the pneumatic support 20, 30 is controllable by the pressure of pressurized gas in the pressure chamber. The pneumatic support 20, 30 is connected to the frame 10 in such a way that controlling the position of the moveable piston of the respective pneumatic support 20, 30 allows to control the position of the frame 10, in particular the position of the respective support location 21, 31 of the frame 10. For example, the moveable piston may be connected to a rod, which rod is also connected to the frame 10, e.g. at the respective support location 21, 31. For example, in this way the position of the moveable piston within the respective pneumatic support can be related to the position, e.g. a vertical position, of the respective support location 21, 31 of the frame 10 to which said pneumatic support 20, 30 is connected.

In the embodiment of FIG. 6, the lithographic apparatus further comprises a frame position control system 40. The frame position control system 40 comprises a first position sensor device 41. The first position sensor device 41 is configured to generate measurement data relating to the position of the frame 10, e.g. the vertical position (i.e. position in z-direction) of the frame 10 relative to the reference 15. The first position sensor device 41 may for example comprise an inductive sensor, and encoder based sensor, an eddy current sensor, a capacitive sensor and/or an interferometer.

The frame position control system 40 further comprises a first pressure controller 42. The first pressure controller 42 is configured to control a pressure in the pressure chamber of the first pneumatic support 20 on the basis of the measurement data generated by the first position sensor device 41. The first pressure controller 42 is configured to receive the measurement data from the first position sensor device 41 via data connection 47 and process this data into a pressure control signal. For example, a first pressure control valve 45 is provided which is controlled by the first pressure controller 42 via data connection 48, by using the pressure control signal that is generated by the first pressure controller 42. The first pressure control valve 45 is for example arranged in a pressure line 49, which may be in communication which a reservoir of pressurized gas (not shown in the figures). Each of the data connections 47, 48 is a for example wired connection comprising one or more electrical wires or optical fibres, or a wireless connection comprising a sender and an associated receiver.

The frame position control system 40 further comprises a pressure differential sensor device 43. The pressure differential sensor device 43 is configured to generate data relating to a difference between the pressure in the pressure chamber of the first pneumatic support 20 and a pressure in the pressure chamber of the second pneumatic support 30. The pressure differential sensor device 43 is connected to the first pneumatic support via connection 55 and to the second pneumatic support via connection 56. These connections can be e.g. gas conduits or data connections.

In addition, the frame position control system 40 comprises a second pressure controller 44. The second pressure controller 44 is configured to control the pressure in the pressure chamber of the second pneumatic support 30 on the basis of the measurement data generated by the pressure differential sensor device 43. The second pressure controller 44 is configured to receive the measurement data from the pressure differential sensor device 43 via data connection 57 and process this data into a pressure control signal. For example, a second pressure control valve 46 is provided which is controlled by the second pressure controller 44 via data connection 58, by using the pressure control signal that is generated by the second pressure controller 44. The second pressure control valve 46 is for example arranged in a pressure line 59, which may be in communication which a reservoir of pressurized gas (not shown in the figures). This reservoir can be the same reservoir which is in communication with first pressure control valve 45 or a different reservoir. Each of the data connections 47, 48 is a for example wired connection comprising one or more electrical wires or optical fibres, or a wireless connection comprising a sender and an associated receiver.

In this embodiment, two further supports 50*, 60* are provided. In the embodiment of FIG. 6, the further supports 50*, 60* optionally are pneumatic supports.

In this embodiment, the first pneumatic support 20 is controlled on the basis of a measured position of the frame 10. The second pneumatic support 30 is controlled on the basis of the difference between the pressure in the pressure chamber of the first pneumatic support 20 and the pressure in the pressure chamber of the second pneumatic support 30. This way, the force exerted onto the frame by the first pneumatic support 20 and the force exerted onto the frame by the second pneumatic support 30 are linked to each other. This allows to control the torque which is exerted onto the frame by the first and second pneumatic supports 20,30, or to reduce this torque to zero.

The invention for example allows to set a set point for the desired pressure difference between the pressures in the pressure chambers of the first and second pneumatic supports 20, 30. The frame position control system 40 is then configured to strive for obtaining this desired pressure difference set point. For example, the set point for the desired pressure difference between the pressures in the pressure chambers of the first and second pneumatic supports 20, 30 could be zero, which means that the pressure in the pressure chambers of the first and second pneumatic supports is desired to be equal. As a result, the force exerted onto the frame by the first pneumatic support 20 and the force exerted onto the frame by the second pneumatic support 30 are equal to each other. This means that the forces exerted by the first pneumatic support 20 and the second pneumatic support 30 do not cause a torque on the frame 10. This way, the deformation of the frame 10 that could potentially be caused by the first and the second pneumatic supports 20, 30 is at least partly reduced.

However, the design of the frame assembly or the lithographic apparatus comprising the frame assembly may lead to a set point for the desired pressure difference which is different from zero. For example, if a disturbing torque is exerted onto frame 10 due to a different reason, this torque could be counteracted by a torque that is exerted by the first and second pneumatic support 20,30 due to a set point for the desired pressure difference which is different from zero. This set point being different from zero leads to a difference between the force that the first pneumatic support 20 exerts on the frame 10 and the force that the second pneumatic support 30 exerts on the frame. These different forces result in a torque, which can be used to counteract the disturbing torque.

The pressure differential sensor device 43 may comprise a pressure differential sensor which is in fluid communication with both the pressure chamber of the first pneumatic support 20 and the pressure chamber of the second pneumatic support 30. In this embodiment, the pressure differential sensor device 43 comprises a first gas conduit (indicated by line 55 in FIG. 6) which extends from the pressure chamber of the first pneumatic support 20 to the pressure differential sensor and a second gas conduit (indicated by line 56 in FIG. 6) which extends from the pressure chamber of the second pneumatic support 30 to the pressure differential sensor. These conduits can have a relatively small inner diameter, e.g. between 1 mm and 5 mm. As in practice the variations in the pressure in the pressure chambers are small, the gas flow within the first and second gas conduits will be zero or very low. Therefore, generally no or only limited issues with acoustic effects in these gas conduits will occur. In addition, the measurement of the differential pressure can be carried out in a reliable and/or accurate way, as the range of the pressure differential sensor device 43 can be selected on the basis of the expected pressure difference between the respective pressure chambers instead of on the basis of the static pressure inside the respective pressure chambers, which static pressure is generally significantly larger than the pressure differences.

In a variant of this embodiment, the pressure differential sensor device 43 comprises a first pressure sensor which is configured generate measurement data relating to the pressure in the pressure chamber of the first pneumatic support 20. The pressure differential sensor device 43 further comprises a second pressure sensor which is configured generate measurement data relating to the pressure in the pressure chamber of the second pneumatic support 30. The measurement data from the first and second pressure sensors is then processed into data relating to the pressure difference between the pressure in the pressure chamber of the first pneumatic support 20 and the pressure in the pressure chamber of the second pneumatic support 30. This data is then used by the second pressure controller 44 to control the pressure in the pressure chamber of the second pneumatic support 30. This variant has the advantage that no additional gas conduits are required.

Figure 7:
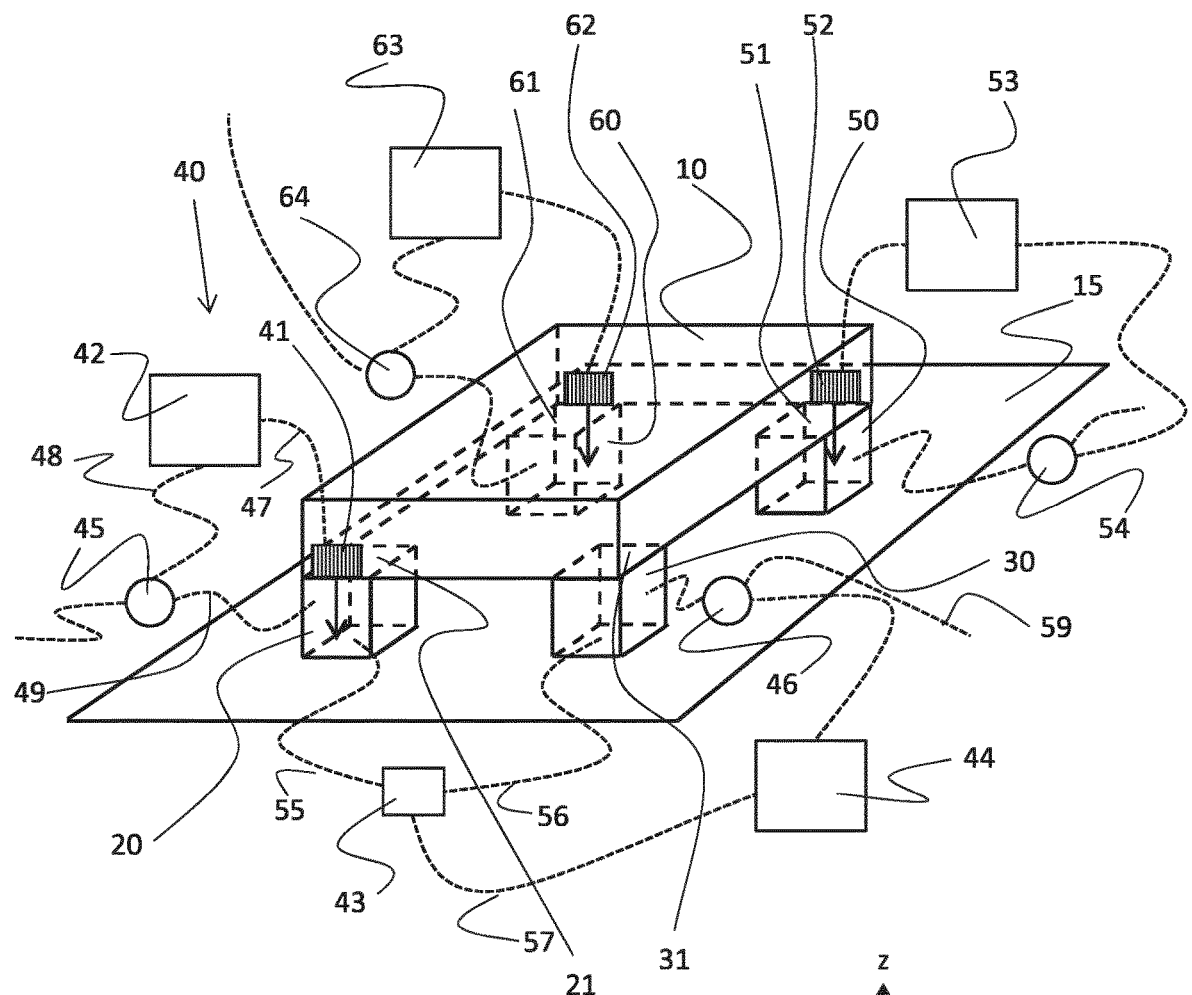
FIG. 7 depicts a schematic representation of a second embodiment of the invention.

FIG. 7 shows a schematic representation of a second embodiment of the invention.

In this embodiment, a frame assembly according to the present invention is schematically shown. Such a frame assembly may e.g. be implemented in a lithographic apparatus such as lithographic apparatus LA. The frame assembly as shown may thus also be considered part of a lithographic apparatus according to the invention. The frame assembly as shown comprises a frame 10. The frame 10 is supported by a first pneumatic support 20, a second pneumatic support 30, a third pneumatic support 50 and a fourth pneumatic support 60. The four pneumatic supports 20, 30, 50, 60 are arranged to control a position of the frame 10 relative to a reference 15. The reference 15 may for example be the base frame BF. In the embodiment of FIG. 7, the four pneumatic supports 20, 30, 50, 60 are configured to control a vertical position of the frame 10 relative to the reference 15. Preferably, the pneumatic supports 20, 30, 50, 60 each bear a part of the weight of the frame 10.

The first pneumatic support 20 is connected to the frame at a first support location 21. The second pneumatic support 30 is connected to the frame at a second support location 31. The third pneumatic support 50 is connected to the frame at a third support location 51. The fourth pneumatic support 60 is connected to the frame at a fourth support location 61. Each of said pneumatic supports 20, 30, 50, 60 accommodates a pressure chamber. The pneumatic supports 20, 30, 50, 60 are optionally of the same design as is described in relation to the embodiment of FIG. 6.

In the embodiment of FIG. 7, the frame assembly or lithographic apparatus further comprises a frame position control system 40. The frame position control system 40 comprises a first position sensor device 41. The first position sensor device 41 is in this embodiment configured to generate measurement data relating to the position of the first support location 21 of the frame 10. In this embodiment the measurement data that is generated by the first position sensor device 41 relates to the vertical position (i.e. the position in z-direction) of the first support position 21 relative to the reference 15. The first position sensor device 41 may for example comprise an inductive sensor, and encoder based sensor, an eddy current sensor, a capacitive sensor and/or an interferometer.

The first position sensor device 41 may optionally be configured to alternatively or in addition generate measurement data relating to the position of the second support location 31 of the frame 10 (this is not shown in FIG. 7). If measurement data is generated relating to the position of both the first and the second support locations 21, 31 of the frame 10, the first position device 41 may comprise two sensors: one sensor for generating measurement data relating to the position of the first support location 21 and one sensor for generating measurement data relating to the position of the second support location 31. In an alternative variant of this embodiment, the first position sensor device 41 may be configured to generate measurement data relating to the position of a further location of the frame 10 which is not one of the support locations 21, 31, 51, 61. The position of this further location may be determined in addition to the determination of the position of the first support location 21 of the frame 10, or even as an alternative for the determination of the position of the first support location 21 of the frame 10.

The frame position control system 40 further comprises a first pressure controller 42. The first pressure controller 42 is configured to control the pressure in the pressure chamber of the first pneumatic support 20 on the basis of the measurement data generated by the first position sensor device 41. The first pressure controller 42 is configured to receive the measurement data from the first position sensor device 41 via data connection 47 and process this data into a pressure control signal. For example, a first pressure control valve 45 is provided which is controlled by the first pressure controller 42 via data connection 48, by using the pressure control signal that is generated by the first pressure controller 42. The first pressure control valve 45 is for example arranged in a pressure line 49, which may be in communication which a reservoir of pressurized gas (not shown in the figures). Each of the data connections 47, 48 is for example a wired connection comprising one or more electrical wires or optical fibres, or a wireless connection comprising a sender and an associated receiver.

In case the first position sensor device comprises multiple sensors, the measurement data generated by each of these sensors may be transferred to the first pressure controller 42 in the form of separate measurement signals. Alternatively, the measurement data that is generated by each of the sensors is combined in the first position sensor device 41 into a single measurement signal, which is transferred to and received by the first pressure controller 42.

The frame position control system 40 further comprises a pressure differential sensor device 43. The pressure differential sensor device 43 is configured to generate data relating to the difference between the pressure in the pressure chamber of the first pneumatic support 20 and the pressure in the pressure chamber of the second pneumatic support 30. The pressure differential sensor device 43 is connected to the first pneumatic support via connection 55 and to the second pneumatic support via connection 56. These connections can be e.g. gas conduits or data connections.

In addition, the frame position control system 40 comprises a second pressure controller 44. The second pressure controller 44 is configured to control the pressure in the pressure chamber of the second pneumatic support 30 on the basis of the measurement data generated by the pressure differential sensor device 43. The second pressure controller 44 is configured to receive the measurement data from the pressure differential sensor device 43 via data connection 57 and process this data into a pressure control signal. For example, a second pressure control valve 46 is provided which is controlled by the second pressure controller 44 via data connection 58, by using the pressure control signal that is generated by the second pressure controller 44. The second pressure control valve 46 is for example arranged in a pressure line 59, which may be in communication which a reservoir of pressurized gas (not shown in the figures). This reservoir can be the same reservoir which is in communication with first pressure control valve 45 or a different reservoir. Each of the data connections 47, 48 is a for example wired connection comprising one or more electrical wires or optical fibres, or a wireless connection comprising a sender and an associated receiver.

In the embodiment of FIG. 7, the first pneumatic support 20 is controlled on the basis of a measured position of first support location 21 of the frame 10. The second pneumatic support 30 is controlled on the basis of the difference between the pressure in the pressure chamber of the first pneumatic support 20 and the pressure in the pressure chamber of the second pneumatic support 30. This way, the force exerted onto the frame by the first pneumatic support 20 and the force exerted onto the frame by the second pneumatic support 30 are linked to each other. This allows to control the torque which is exerted onto the frame by the first and second pneumatic supports 20,30, or to reduce this torque to zero.

In the embodiment of FIG. 7, the frame position control system 40 further comprises a third position sensor device 52. The third position sensor device 52 is configured to generate measurement data relating to the position of the third support location 51 of the frame 10. In this embodiment the measurement data that is generated by the third position sensor device 52 relates to the vertical position (i.e. the position in z-direction) of the third support location 51 relative to the reference 15. The third position sensor device 52 may for example comprise an inductive sensor, and encoder based sensor, an eddy current sensor, a capacitive sensor and/or an interferometer.

The frame position control system 40 further comprises a third pressure controller 53, which is configured to control the pressure in the pressure chamber of the third pneumatic support 50 on the basis of the measurement data generated by the third position sensor device 52. The third pressure controller 53 is configured to receive the measurement data from the third position sensor device 52 by a data connection (indicated by a dashed line in FIG. 7) and process this data into a pressure control signal. For example, a first pressure control valve 54 is provided which is controlled by the third pressure controller 53 by a data connection (indicated by a dashed line in FIG. 7), by using this pressure control signal. The third pressure control valve 54 may be in communication which a reservoir of pressurized gas. Each of the data connections is a for example wired connection comprising one or more electrical wires or optical fibres, or a wireless connection comprising a sender and an associated receiver.

In the embodiment of FIG. 7, the frame position control system 40 further comprises a fourth position sensor device 62. The fourth position sensor device 62 is configured to generate measurement data relating to the position of the fourth support location 61 of the frame 10. In this embodiment the measurement data that is generated by the fourth position sensor device 62 relates to the vertical position (i.e. the position in z-direction) of the fourth support location 61 relative to the reference 15. The fourth position sensor device 62 may for example comprise an inductive sensor, and encoder based sensor, an eddy current sensor, a capacitive sensor and/or an interferometer.

The frame position control system 40 further comprises a fourth pressure controller 63, which is configured to control the pressure in the pressure chamber of the fourth pneumatic support 60 on the basis of the measurement data generated by the fourth position sensor device 62. The fourth pressure controller 63 is configured to receive the measurement data from the fourth position sensor device 62 by a data connection (indicated by a dashed line in FIG. 7) and process this data into a pressure control signal. For example, a first pressure control valve 64 is provided which is controlled by the fourth pressure controller 63 by a data connection (indicated by a dashed line in FIG. 7), by using this pressure control signal. The fourth pressure control valve 64 may be in communication which a reservoir of pressurized gas. Each of the data connections is a for example wired connection comprising one or more electrical wires or optical fibres, or a wireless connection comprising a sender and an associated receiver.

In the embodiment of FIG. 7, three of the four pneumatic supports are controlled on the basis of measurement of the position of the frame 10 or of a relevant part of the frame 10 relative to the reference 15. The other one of the four pneumatic supports is controlled on the basis of a determined pressure difference between the pressure in its own pressure chamber and the pressure inside the pressure chamber of an associated pneumatic support, which is one of the other pneumatic supports which are being controlled on the basis of position measurements. This way, the pneumatic support which is controlled on the basis of the pressure difference follows the actions of the associated pneumatic support. This results in that the pneumatic support which is controlled on the basis of the pressure difference, so that this pneumatic support e.g. exerts the same force as the associated pneumatic support, so that no torque is exerted upon the frame 10 between the pneumatic support which is controlled on the basis of the pressure difference and the associated pneumatic support by the actions of these two pneumatic supports. Alternatively, there is a known difference between the forces exerted by the pneumatic support which is controlled on the basis of the pressure difference and by the associated pneumatic support, which leads to a defined torque being exerted onto frame 10. This defined torque can for example be used to counteract a disturbing torque that is exerted onto the frame 10 by a different cause.

In the embodiments of FIG. 6 and FIG. 7, the frame 10 may be for example a frame of the projection system, e.g. a force frame of the projection system, or a frame of an illumination system, or a wafer stage metrology frame. The reference 15 may for example be the base frame BF, or the floor onto which the lithographic apparatus is installed, or a pedestal onto which the lithographic apparatus is arranged.

Figure 8:
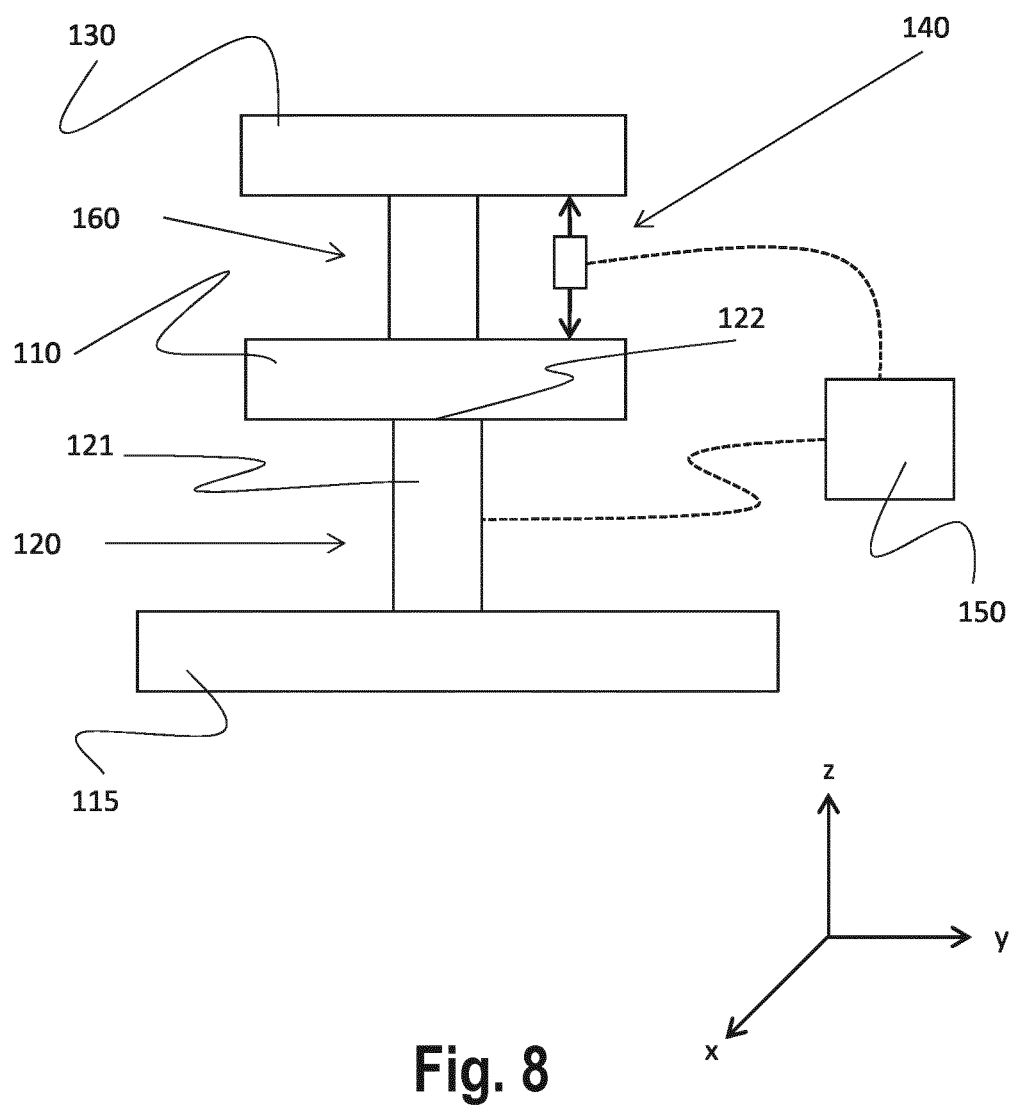
FIG. 8 depicts a schematic representation of a third embodiment of the invention.

FIG. 8 shows a schematic representation of a third embodiment of the invention.

In the embodiment of FIG. 8, the lithographic apparatus or frame apparatus comprises a first frame 110. The first frame 110 is supported by a first frame support 120 comprising a first pneumatic support 121 accommodating an actuator. The first pneumatic support 120 is arranged to control a position of the first frame 110 relative to a first frame reference 115, for example a vertical position (i.e. a position in the z-direction) of the first frame 110 relative to the first frame reference 115. The first frame reference may be for example the base frame or the floor onto which the lithographic apparatus is installed. The first pneumatic support 121 is connected to the first frame 110 at a first support location 122.

In the embodiment of FIG. 8, the lithographic apparatus further comprises a second frame 130. This second frame 130 is not the first frame reference 115.

In the embodiment of FIG. 8, the lithographic apparatus or frame apparatus further comprises a second frame position measurement system 140, which is configured to generate measurement data relating to the position of the second frame 130 relative to the first frame 110, e.g. in vertical direction.

In the embodiment of FIG. 8, the lithographic apparatus further comprises a first frame position control system 150, which is configured to receive said measurement data generated by the second frame position measurement system 140, and to control the actuator of the first pneumatic support 121 on the basis of said measurement data.

The first pneumatic support for example comprises a pressure chamber which accommodates a moveable piston. The pressure chamber is partly delimited by said moveable piston. The pressure chamber is suitable for accommodating pressurized gas, and the position of the moveable piston within the first pneumatic support 121 is controllable by the pressure of pressurized gas in the pressure chamber. The first pneumatic support 121 is e.g. connected to the first frame 110 in such a way that controlling the position of the moveable piston of the first pneumatic support 121 allows to control the position of the first frame 110, e.g. the position of the first support location 122 of the frame 110. For example, the moveable piston may be connected to a rod, which rod is also connected to the first frame 110, e.g. at the first support location 122. For example, in this way the position of the moveable piston within the first pneumatic support 121 can be related to the position, e.g. a vertical position, of the first frame 110 (e.g. of the first support location 122 on the first frame 11) to which said pneumatic support 121 is connected. The combination of the piston and the rod can be regarded as an actuator, and the force that is exerted by this combination of the piston and the rod can be controlled by controlling the pressure in the pressure chamber.

The first pneumatic support may in addition comprise a Lorentz actuator, which is for example mounted parallel to the rod. The Lorentz actuator can for example be used to control the position of the first frame 110 at higher frequencies, as it has a shorter response time than the combination of the piston and the rod. The actuator which is controlled by the first frame position control system 150 is in this embodiment the Lorentz actuator, the combination of the piston and the rod, or both. For example, the force exerted onto the first frame 110 by the actuator of the first pneumatic support 121 may be controlled on the basis of the measured deformation of the second frame 130, so that undesired or disturbing torques on the first frame 110 can be fully or at least partly counteracted.

In the embodiment of FIG. 8, the position of the second frame 130 is determined in order to control the actuator of the first pneumatic support 121 of the first frame support 120 which supports the first frame 110. This is in particular advantageous if the second frame 130 is already equipped with a position measurement system 140 for other reasons. In that case, no additional sensors have to be installed.

The information relating to the deformation of the first frame 110, measured relative to the second frame 130 can be used to control the actuator of the first pneumatic support 121 of the first frame support 120 in order to reduce or suppress undesired deformation of the first frame 110. This can for example be achieved by controlling the force that is exerted onto the first frame 110 by the first pneumatic support.

Figure 9:
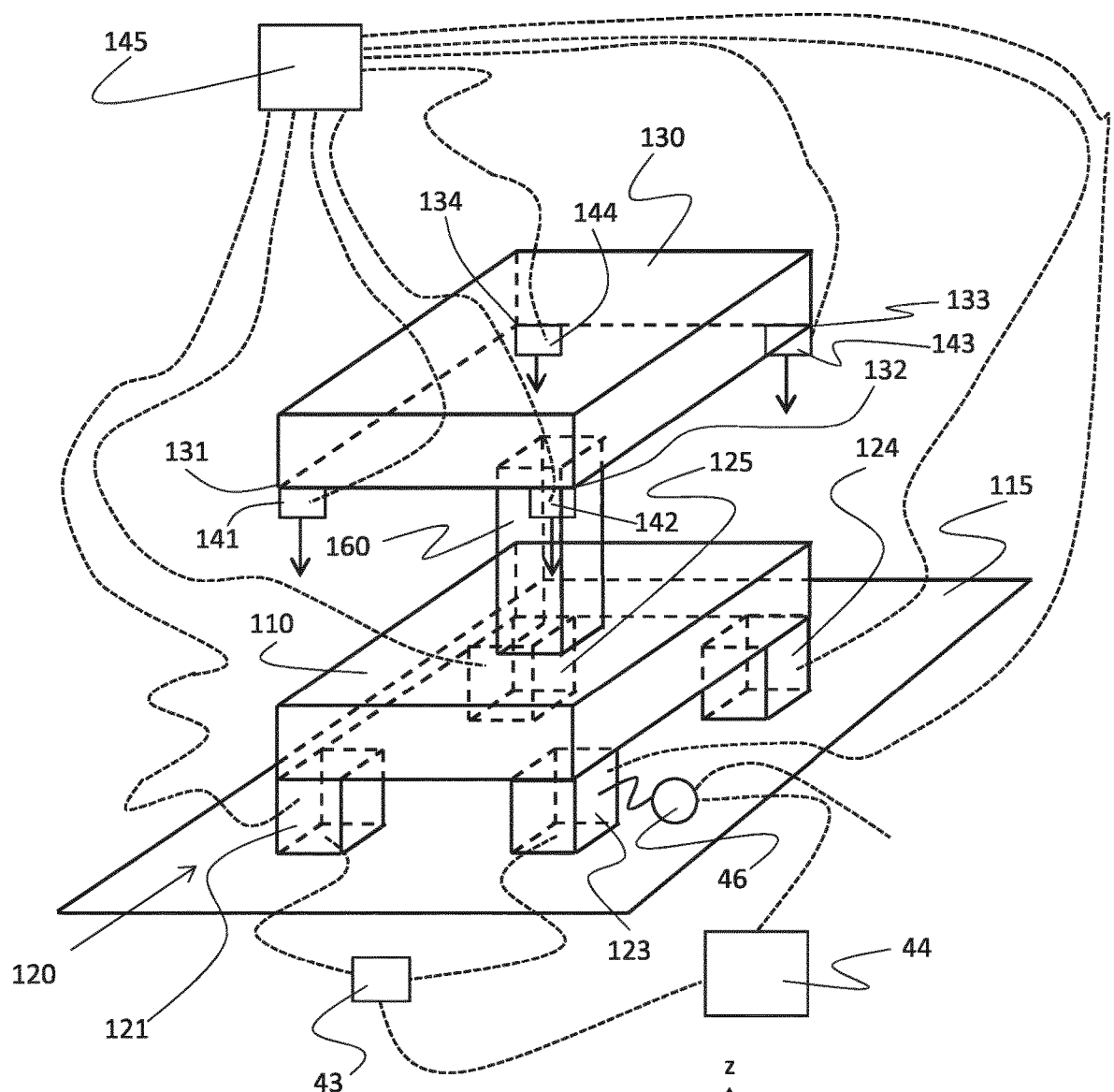
FIG. 9 depicts a schematic representation of a fourth embodiment of the invention.

FIG. 9 shows a schematic representation of a fourth embodiment of the invention.

The embodiment of FIG. 9 is a variant of the embodiment of FIG. 8, in which also the principles of the embodiment of FIGS. 6 and 7 can be applied.

In the embodiment of FIG. 9, the first frame 110 is supported by a first frame support 120 comprising a first pneumatic support 121 comprising an actuator (e.g. a combination of a piston and a rod as described above and/or a Lorentz actuator). The first pneumatic support 120 is arranged to control a position of the first frame 110 relative to a first frame reference 115, for example a vertical position (i.e. a position in the z-direction) of the first frame 110 relative to the first frame reference 115. The first pneumatic support 121 is connected to the first frame 110 at a first support location.

In the embodiment of FIG. 9, the lithographic apparatus further comprises a second frame 130. This second frame 130 is not the first frame reference 115. The second frame 130 is supported on the first frame 110 by a second frame support 160. In FIG. 9, the second frame support 160 has been indicated schematically. The second frame support 160 may for example comprise four vibration isolators which are arranged at or near the corners of the second frame 130.

In the embodiment of FIG. 9, the frame assembly or lithographic apparatus further comprises a second frame position measurement system 140, which is configured to generate measurement data relating to the position of the second frame 130 relative to the first frame 110.

In the embodiment of FIG. 9, the lithographic apparatus further comprises a first frame position control system 150, which is configured to receive said measurement data generated by the second frame position measurement system 140, and to control the actuator of at least one pneumatic support 121 of the first frame support 120 on the basis of said measurement data, e.g. to control the force that this pneumatic support exerts on the first frame 110, e.g. to control the vertical force that this pneumatic support exerts on the first frame 110.

In the embodiment of FIG. 9, the first frame support 120 comprises four pneumatic supports 121, 123, 124, 125. So, four pneumatic supports 121, 123, 124, 125 are used to support the first frame 110. The second pneumatic support 123 is connected to the first frame 110 at a second support location. The third pneumatic support 124 is connected to the first frame 110 at a third support location. The fourth pneumatic support 125 is connected to the first frame 110 at a fourth support location. All these four pneumatic supports 121, 1231, 124, 125 comprise an actuator (e.g. a combination of a piston and a rod as described above and/or a Lorentz actuator).

In the embodiment of FIG. 9, the second frame position measurement system 140 is configured to generate measurement data relating to the position of a first location 131, a second location 132, a third location 133 and a fourth location 134 of the second frame 130 relative to the first frame 110. The second frame position measurement system 140 to this end comprises four position sensors 141, 142, 143, 144. Alternatively, a different number of sensors (e.g. three sensors) can be used.

The measurement data that is generated by all sensors 141, 142, 143, 144 or by a subgroup of the sensors 141, 142, 143, 144 of the second position measurement system 140 can be processed to form a control signal which is used to control an actuator in any of the pneumatic supports 121, 123, 124, 125, or to control actuators of any combination of these pneumatic supports. Alternatively, measurement data from a single sensor 141, 142, 143, 144 may be used to control the actuator in a single one of the pneumatic actuators 121, 123, 124, 125. In the embodiment of FIG. 9, a processing unit 145 is provided to generate the respective control signal or control signals, and to transfer the control signal or control signals to the actuator(s) of the relevant pneumatic supports(s).

In the embodiment of FIG. 9, the measurement data generated by the sensors 141, 142, 143, 144 of the second frame position measurement system 140 is transformed into four signals by the processing unit 145. The first signal of these four is sent to the Lorentz actuator of the first pneumatic support 121. Likewise, the second signal is sent to the Lorentz actuator of the second pneumatic support 123, the third signal to the Lorentz actuator of the third pneumatic support 124 and the fourth signal to the Lorentz actuator of the fourth pneumatic support 124.

For example, the control signals are used to control the force that is exerted onto the first frame 110 by each of the pneumatic supports 121, 123, 124, 125.

The sensors 141, 142, 143, 144 are connected to the processing unit by an associated data connection (indicated by dashed lines in FIG. 9). The processing unit 145 is connected to each of the pneumatic supports by an associated data connection. Each of the data connections is a for example wired connection comprising one or more electrical wires or optical fibres, or a wireless connection comprising a sender and an associated receiver.

In addition, in this embodiment, the first frame position control system 150 further comprises a pressure differential sensor device 43. The pressure differential sensor device 43 is configured to generate data relating to a difference between a pressure in the pressure chamber of the first pneumatic support 121 and a pressure in the pressure chamber of the second pneumatic support 123.

Furthermore, in this embodiment, the first frame position control system 150 comprises a second pressure controller 44. The second pressure controller 44 is configured to control the pressure in the pressure chamber of the second pneumatic support 123 on the basis of the measurement data generated by the pressure differential sensor device 43. The second pressure controller 44 is configured to receive the measurement data from the pressure differential sensor device 43 and process this data into a pressure control signal.

For example, a second pressure control valve 46 is provided which is controlled by the second pressure controller 44, by using the pressure control signal that is generated by the second pressure controller 44.

Figure 10:
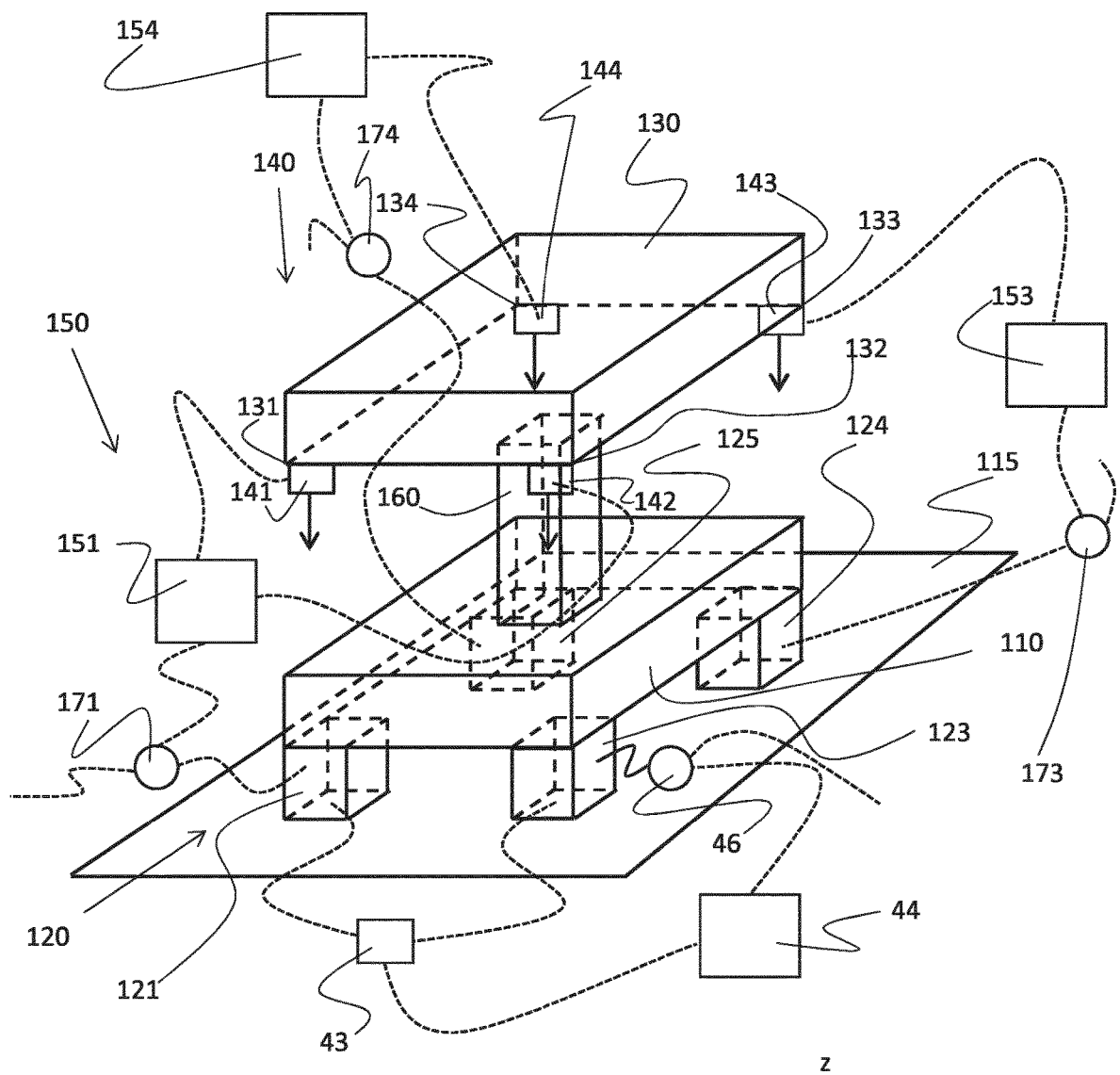
FIG. 10 depicts a schematic representation of a fifth embodiment of the invention.
Figure 10:
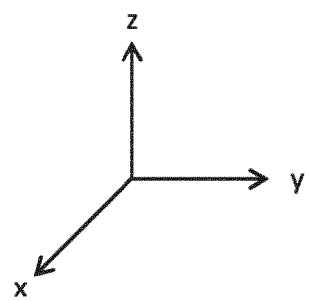

FIG. 10 shows a schematic representation of a fifth embodiment of the invention.

The embodiment of FIG. 10 is a variant of the embodiment of FIG. 8, in which also the principles of the embodiment of FIGS. 6 and 7 can be applied.

In the embodiment of FIG. 10, the first frame 110 is supported by a first frame support 120 comprising a first pneumatic support 121 accommodating a pressure chamber. The first pneumatic support 120 is arranged to control a position of the first frame 110 relative to a first frame reference 115, for example a vertical position (i.e. a position in the z-direction) of the first frame 110 relative to the first frame reference 115. The first pneumatic support 121 is connected to the first frame 110 at a first support location.

In the embodiment of FIG. 10, the frame assembly or lithographic apparatus further comprises a second frame 130. This second frame 130 is not the first frame reference 115. The second frame 130 is supported on the first frame 110 by a second frame support 160. In FIG. 10, the second frame support 160 has been indicated schematically. The second frame support 160 may for example comprise four vibration isolators which are arranged at or near the corners of the second frame 130.

In the embodiment of FIG. 10, the lithographic apparatus further comprises a second frame position measurement system 140, which is configured to generate measurement data relating to the position of the second frame 130 relative to the first frame 110.

In the embodiment of FIG. 10, the frame assembly or lithographic apparatus further comprises a first frame position control system 150, which is configured to receive said measurement data generated by the second frame position measurement system 140, and to control the pressure in the pressure chamber of the first pneumatic support 121 on the basis of said measurement data.

In the embodiment of FIG. 10, the first frame support 120 comprises four pneumatic supports 121, 123, 124, 125. So, four pneumatic supports 121, 123, 124, 125 are used to support the first frame 110. The second pneumatic support 123 is connected to the first frame 110 at a second support location. The third pneumatic support 124 is connected to the first frame 110 at a third support location. The fourth pneumatic support 125 is connected to the first frame 110 at a fourth support location. All these four pneumatic supports 121, 1231, 124, 125 accommodate a pressure chamber.

In the embodiment of FIG. 10, the second frame position measurement system 140 is configured to generate measurement data relating to the position (e.g. the vertical position) of a first location 131, a second location 132, a third location 133 and a fourth location 134 of the second frame 130 relative to the first frame 110. The second frame position measurement system 140 to this end comprises four position sensors 141, 142, 143, 144. Alternatively, a different number of sensors can be applied.

In the embodiment of FIG. 10, the pressure in the pressure chamber of the first pneumatic support 121 is controlled on the basis of the measurement data relating to the first location 131 of the second frame 130. The measurement data which is generated by position sensor 141 of the second frame position measurement system 140 is transferred to and received by pressure controller 151 of the first frame position control system 150, which for example controls control valve 171 to control the pressure in the pressure chamber of the first pneumatic support 121 of the first frame support 120.

In the embodiment of FIG. 10, the pressure in the pressure chamber of the third pneumatic support 124 is controlled on the basis of the measurement data relating to the third location 133 of the second frame 130. The measurement data which is generated by position sensor 143 of the second frame position measurement system 140 is transferred to and received by pressure controller 153 of the first frame position control system 150, which for example controls control valve 173 to control the pressure in the pressure chamber of the third pneumatic support 124 of the first frame support 120.

In the embodiment of FIG. 10, the pressure in the pressure chamber of the fourth pneumatic support 125 is controlled on the basis of the measurement data relating to the fourth location 134 of the second frame 130. The measurement data which is generated by position sensor 144 of the second frame position measurement system 140 is transferred to and received by pressure controller 154 of the first frame position control system 150, which for example controls control valve 174 to control the pressure in the pressure chamber of the fourth pneumatic support 125 of the first frame support 120.

With respect to the control of the second pneumatic support 123, there are two options. The first option (not shown in FIG. 10), is to do the same as for the control of the other pneumatic supports 121, 124, 125. So, the pressure in the pressure chamber of the second pneumatic support 123 is then controlled on the basis of the measurement data relating to the second location 132 of the second frame 130. The measurement data which is generated by position sensor 142 of the second frame position measurement system 140 is transferred to and received by a pressure controller of the first frame position control system 150, which for example controls a control valve to control the pressure in the pressure chamber of the second pneumatic support 123 of the first frame support 120.

The other option is to use the principles of the embodiments of FIGS. 6 and 7. This is shown in FIG. 10. In this embodiment, the first frame position control system 150 further comprises a pressure differential sensor device 43. The pressure differential sensor device 43 is configured to generate data relating to the difference between the pressure in the pressure chamber of the first pneumatic support 121 and the pressure in the pressure chamber of the second pneumatic support 123.

In addition, in this embodiment, the first frame position control system 150 comprises a second pressure controller 44. The second pressure controller 44 is configured to control the pressure in the pressure chamber of the second pneumatic support 123 on the basis of the measurement data generated by the pressure differential sensor device 43. The second pressure controller 44 is configured to receive the measurement data from the pressure differential sensor device 43 and process this data into a pressure control signal. For example, a second pressure control valve 46 is provided which is controlled by the second pressure controller 44, by using the pressure control signal that is generated by the second pressure controller 44.

In this embodiment, the measurement data from position sensor 142 may be combined with the measurement data from position sensor 141 for the control of the pressure in the pressure chamber of the first pneumatic support 121. Alternatively, position sensor 142 can be left out of the design.

In the embodiment of FIG. 10, whichever option is chosen for the control of the second pneumatic support 123, the deformation of the first frame 110 can be directly counteracted by the pneumatic supports 121, 123, 124, 125 of the first frame support 120.

In the embodiment of FIG. 10, there is a direct relation between the measurement data generated by the a particular position sensor and an associated pneumatic support. In a variant of this embodiment, instead a processing unit of the type shown in FIG. 9 can be provided.

In the embodiments of FIGS. 8, 9 and 10, the first frame may be a force frame, e.g. a projection system force frame. Alternatively, the first frame may be a wafer stage metrology frame.

In the embodiments of FIGS. 8, 9 and 10, the second frame may be a sensor frame, e.g. a projection system sensor frame. Alternatively, the second frame may be a wafer stage metrology frame.

In the embodiments of FIGS. 8 9 and 10, the first frame reference is a base frame, or a pedestal or floor onto which the lithographic apparatus is arranged.

The present invention can also be characterized by the following clauses:

1. A lithographic apparatus, comprising:
   a frame,
   a first and a second pneumatic support, these pneumatic supports being arranged to control a position of the frame relative to a reference,
   the first pneumatic support being connected to the frame at a first support location, the second pneumatic support being connected to the frame at a second support location, each of said pneumatic supports accommodating a pressure chamber,
   a frame position control system, which frame position control system comprises:
      a first position sensor device, which is configured to generate measurement data relating to the position of the frame,
      a first pressure controller, which is configured to control a pressure in the pressure chamber of the first pneumatic support on the basis of the measurement data generated by the first position sensor device,
      a pressure differential sensor device, which is configured to generate data relating to a difference between the pressure in the pressure chamber of the first pneumatic support and a pressure in the pressure chamber of the second pneumatic support,
      a second pressure controller, which is configured to control the pressure in the pressure chamber of the second pneumatic support on the basis of the measurement data generated by the pressure differential sensor device.

2. The lithographic apparatus according to clause 1, wherein the second pressure controller is configured to control the pressure in the pressure chamber of the second pneumatic support in such way that the difference between the pressure in the pressure chamber of the first pneumatic support and the pressure in the pressure chamber of the second pneumatic support is brought below a threshold value, e.g. brought to zero.

3. The lithographic apparatus according to any of the preceding clauses,
   wherein the first and second pneumatic supports are configured to control a vertical position of the frame relative to the reference.

4. The lithographic apparatus according to any of the preceding clauses, wherein the first position sensor device is configured to generate measurement data relating to the position of the first and/or second support location of the frame.

5. The lithographic apparatus according to any of the preceding clauses, wherein the lithographic apparatus further comprises a third pneumatic support and a fourth pneumatic support, the third pneumatic support being connected to the frame at a third support location, the fourth pneumatic support being connected to the frame at a fourth support location.

6. The lithographic apparatus according to clauses 5, wherein each of said third and fourth pneumatic supports accommodates a pressure chamber, and wherein the frame position control system further comprises:
- a third position sensor device, which is configured to generate measurement data relating to the position of the third support location of the frame,
    - a third pressure controller, which is configured to control a pressure in the pressure chamber of the third pneumatic support on the basis of the measurement data generated by the third position sensor device,
- a fourth position sensor device, which is configured to generate measurement data relating to the position of the fourth support location of the frame,
    - a fourth pressure controller, which is configured to control a pressure in the pressure chamber of the fourth pneumatic support on the basis of the measurement data generated by the third position sensor device.

7. The lithographic apparatus according to any of the preceding clauses, wherein the frame is a frame of the projection system, e.g. a force frame of the projection system, or a frame of an illumination system, or a wafer stage metrology frame.

8. The lithographic apparatus according to any of the preceding clauses, wherein the reference is a base frame or a floor onto which the lithographic apparatus is arranged, or a pedestal onto which the lithographic apparatus is arranged.

9. A lithographic apparatus, comprising:
a first frame,
a first frame support comprising a first pneumatic support comprising an actuator, said first pneumatic support being arranged to control a position of the first frame relative to a first frame reference, said first pneumatic support being connected to the first frame at a first support location,
    a second frame, which second frame is different from the first frame reference, the second frame being supported on the first frame by a second frame support,
    a second frame position measurement system, which is configured to generate measurement data relating to a position of the second frame relative to the first frame,
    a first frame position control system, which is configured to receive said measurement data generated by the second frame position measurement system, and to control the actuator of the first pneumatic support on the basis of said measurement data.

10. The lithographic apparatus according to clause 9, wherein the first frame support further comprises:
a second pneumatic support which is connected to the first frame at a second support location,
a third pneumatic support which connected to the first frame at a third support location, and
a fourth pneumatic support which is connected to the first frame at a fourth support location,
each of said pneumatic supports comprising an actuator.

11. The lithographic apparatus according to clause 10, wherein the second frame position measurement system is configured to generate measurement data relating to the position of a first location, a second location, a third location and a fourth of the second frame relative to the first frame, and wherein second frame position measurement system comprises a processing system to generate a control system on the basis of at least a part of said measurement data.

12. The lithographic apparatus according to any of the clauses 9-11, wherein the first frame is a force frame, e.g. a projection system force frame, or a wafer stage metrology frame.

13. The lithographic apparatus according to any of the clauses 9-12, wherein the second frame is a sensor frame, e.g. a projection system sensor frame or a wafer stage metrology frame.

14. The lithographic apparatus according to any of the clauses 9-13, wherein the first frame reference is a base frame or a floor onto which the lithographic apparatus is arranged, or a pedestal onto which the lithographic apparatus is arranged.

15. A lithographic apparatus, comprising:
a first frame,
a first frame support comprising a first pneumatic support comprising an actuator and a pressure chamber, said first pneumatic support being arranged to control a position of the first frame relative to a first frame reference, said first pneumatic support being connected to the first frame at a first support location, the first frame support further comprising a second pneumatic support, the second pneumatic support being connected to the frame at a second support location, the second pneumatic support accommodating a pressure chamber,
a second frame, which second frame is different from the first frame reference, the second frame being supported on the first frame by a second frame support,
a second frame position measurement system, which is configured to generate measurement data relating to a position of the second frame relative to the first frame,
a first frame position control system, which is configured to receive said measurement data generated by the second frame position measurement system, and to control the actuator of the first pneumatic support on the basis of said measurement data, and wherein the first frame position control system further comprises:
    a pressure differential sensor device, which is configured to generate data relating to a difference between a pressure in the pressure chamber of the first pneumatic support and a pressure in the pressure chamber of the second pneumatic support,
    a second pressure controller, which is configured to control the pressure in the pressure chamber of the second pneumatic support on the basis of the measurement data generated by the pressure differential sensor device.

16. A lithographic apparatus, comprising:
a first frame,
a first frame support comprising a first and a second pneumatic support, these pneumatic supports being arranged to control a position of the frame relative to a first frame reference,
the first pneumatic support being connected to the frame at a first support location, the second pneumatic support being connected to the frame at a second support location, each of said pneumatic supports accommodating a pressure chamber,
 a second frame, which second frame is different from the first frame reference, the second frame being supported on the first frame by a second frame support,
 a second frame position measurement system, which is configured to generate measurement data relating to a position of the second frame relative to the first frame,
 a first frame position control system, which is configured to receive said measurement data generated by the second frame position measurement system, which frame position control system comprises:
  a first pressure controller, which is configured to control a pressure in the pressure chamber of the first pneumatic support on the basis of the measurement data generated by the second frame position measurement system,
 a pressure differential sensor device, which is configured to generate data relating to a difference between the pressure in the pressure chamber of the first pneumatic support and a pressure in the pressure chamber of the second pneumatic support,
 a second pressure controller, which is configured to control the pressure in the pressure chamber of the second pneumatic support on the basis of the measurement data generated by the pressure differential sensor device and/or on the basis of measurement data generated by the second frame position measurement system.

17. A device manufacturing method comprising transferring a pattern from a patterning device onto a substrate, comprising the step of using a lithographic apparatus according to one of clauses 1-16.

18. A frame assembly, comprising:
a frame,
a first and a second pneumatic support, these pneumatic supports being arranged to control a position of the frame relative to a reference,
the first pneumatic support being connected to the frame at a first support location, the second pneumatic support being connected to the frame at a second support location, each of said pneumatic supports accommodating a pressure chamber,
 a frame position control system, which frame position control system comprises:
  a first position sensor device, which is configured to generate measurement data relating to the position of the frame,
  a first pressure controller, which is configured to control a pressure in the pressure chamber of the first pneumatic support on the basis of the measurement data generated by the first position sensor device,
  a pressure differential sensor device, which is configured to generate data relating to a difference between the pressure in the pressure chamber of the first pneumatic support and a pressure in the pressure chamber of the second pneumatic support,
  a second pressure controller, which is configured to control the pressure in the pressure chamber of the second pneumatic support on the basis of the measurement data generated by the pressure differential sensor device.

19. The frame assembly according to clause 18,
wherein the second pressure controller is configured to control the pressure in the pressure chamber of the second pneumatic support in such way that the difference between the pressure in the pressure chamber of the first pneumatic support and the pressure in the pressure chamber of the second pneumatic support is brought below a threshold value, e.g. brought to zero.

20. The frame assembly according to any of the clauses 18 to 19,
wherein the first and second pneumatic supports are configured to control a vertical position of the frame relative to the reference.

21. The frame assembly according to any of the clauses 18 to 20,
wherein the first position sensor device is configured to generate measurement data relating to the position of the first and/or second support location of the frame.

22. The frame assembly according to any of the clauses 18 to 21,
wherein the lithographic apparatus further comprises a third pneumatic support and a fourth pneumatic support, the third pneumatic support being connected to the frame at a third support location, the fourth pneumatic support being connected to the frame at a fourth support location.

23. The frame assembly according to clause 22,
wherein each of said third and fourth pneumatic supports accommodates a pressure chamber,
and wherein the frame position control system further comprises:
 a third position sensor device, which is configured to generate measurement data relating to the position of the third support location of the frame,
 a third pressure controller, which is configured to control a pressure in the pressure chamber of the third pneumatic support on the basis of the measurement data generated by the third position sensor device,
 a fourth position sensor device, which is configured to generate measurement data relating to the position of the fourth support location of the frame,
 a fourth pressure controller, which is configured to control a pressure in the pressure chamber of the fourth pneumatic support on the basis of the measurement data generated by the third position sensor device.

24. The frame assembly according to any of the clauses 18 to 23,
wherein the frame is a frame of the projection system, e.g. a force frame of the projection system, or a frame of an illumination system, or a wafer stage metrology frame.

25. The frame assembly according to any of the clauses 18 to 24,
wherein the reference is a base frame or a floor onto which the lithographic apparatus is arranged, or a pedestal onto which the lithographic apparatus is arranged.

26. A frame assembly, comprising:
a first frame,
a first frame support comprising a first pneumatic support comprising an actuator, said first pneumatic support being arranged to control a position of the first frame relative to a first frame reference, said first pneumatic support being connected to the first frame at a first support location, a second frame, which second frame is different from the first frame reference, the second frame being supported on the first frame by a second frame support, a second frame position measurement system, which is configured to generate measurement data relating to a position of the second frame relative to the first frame, a first frame position control system, which is configured to receive said measurement data generated by the second frame position measurement system, and to control the actuator of the first pneumatic support on the basis of said measurement data.

27. The frame assembly according to clause 26, wherein the first frame support further comprises:

a second pneumatic support which is connected to the first frame at a second support location, a third pneumatic support which connected to the first frame at a third support location, and a fourth pneumatic support which is connected to the first frame at a fourth support location, each of said pneumatic supports comprising an actuator.

28. The frame assembly according to clause 27, wherein the second frame position measurement system is configured to generate measurement data relating to the position of a first location, a second location, a third location and a fourth of the second frame relative to the first frame, and wherein second frame position measurement system comprises a processing system to generate a control system on the basis of at least a part of said measurement data.

29. The frame assembly according to any of the clauses 25-28, wherein the first frame is a force frame, e.g. a projection system force frame, or a wafer stage metrology frame.

30. The frame assembly according to any of the clauses 25-29, wherein the second frame is a sensor frame, e.g. a projection system sensor frame or a wafer stage metrology frame.

31. The frame assembly according to any of the clauses 25-30, wherein the first frame reference is a base frame or a floor onto which the lithographic apparatus is arranged, or a pedestal onto which the lithographic apparatus is arranged.

32. A frame assembly, comprising:

a first frame, a first frame support comprising a first pneumatic support comprising an actuator and a pressure chamber, said first pneumatic support being arranged to control a position of the first frame relative to a first frame reference, said first pneumatic support being connected to the first frame at a first support location, the first frame support further comprising a second pneumatic support, the second pneumatic support being connected to the frame at a second support location, the second pneumatic support accommodating a pressure chamber, a second frame, which second frame is different from the first frame reference, the second frame being supported on the first frame by a second frame support, a second frame position measurement system, which is configured to generate measurement data relating to a position of the second frame relative to the first frame, a first frame position control system, which is configured to receive said measurement data generated by the second frame position measurement system, and to control the actuator of the first pneumatic support on the basis of said measurement data, and wherein the first frame position control system further comprises:

a pressure differential sensor device, which is configured to generate data relating to a difference between a pressure in the pressure chamber of the first pneumatic support and a pressure in the pressure chamber of the second pneumatic support, a second pressure controller, which is configured to control the pressure in the pressure chamber of the second pneumatic support on the basis of the measurement data generated by the pressure differential sensor device.

33. A frame assembly, comprising:

a first frame, a first frame support comprising a first and a second pneumatic support, these pneumatic supports being arranged to control a position of the frame relative to a first frame reference, the first pneumatic support being connected to the frame at a first support location, the second pneumatic support being connected to the frame at a second support location, each of said pneumatic supports accommodating a pressure chamber, a second frame, which second frame is different from the first frame reference, the second frame being supported on the first frame by a second frame support, a second frame position measurement system, which is configured to generate measurement data relating to a position of the second frame relative to the first frame, a first frame position control system, which is configured to receive said measurement data generated by the second frame position measurement system, which frame position control system comprises:

a first pressure controller, which is configured to control a pressure in the pressure chamber of the first pneumatic support on the basis of the measurement data generated by the second frame position measurement system, a pressure differential sensor device, which is configured to generate data relating to a difference between the pressure in the pressure chamber of the first pneumatic support and a pressure in the pressure chamber of the second pneumatic support, a second pressure controller, which is configured to control the pressure in the pressure chamber of the second pneumatic support on the basis of the measurement data generated by the pressure differential sensor device and/or on the basis of measurement data generated by the second frame position measurement system Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A frame assembly, comprising:
   a frame,
   a first and a second pneumatic support being arranged to control a position of the frame relative to a reference, the first pneumatic support being connected to the frame at a first support location, the second pneumatic support being connected to the frame at a second support location, and the first and second pneumatic supports accommodating a pressure chamber;
   a frame position control system comprising:
      a first position sensor device configured to generate measurement data relating to the position of the frame,
      a first pressure controller configured to control a pressure in a pressure chamber of the first pneumatic support in response to receiving the measurement data from the first position sensor device,
      a pressure differential sensor device configured to generate measurement data relating to a difference between the pressure in the pressure chamber of the first pneumatic support and a pressure in a pressure chamber of the second pneumatic support, and
      a second pressure controller configured to control the pressure in the pressure chamber of the second pneumatic support in response to receiving the measurement data from the pressure differential sensor device.

2. The frame assembly of claim 1, wherein the second pressure controller is configured to control the pressure in the pressure chamber of the second pneumatic support in such a way that a difference between the pressure in the pressure chamber of the first pneumatic support and the pressure in the pressure chamber of the second pneumatic support is brought below a threshold value or brought to zero.

3. The frame assembly of claim 1, wherein the first and second pneumatic supports are configured to control a vertical position of the frame relative to the reference.

4. The frame assembly of claim 1, wherein the first position sensor device is configured to generate measurement data relating to the position of the first and/or second support location of the frame.

5. The frame assembly of claim 1, further comprising a third pneumatic support and a fourth pneumatic support, the third pneumatic support being connected to the frame at a third support location and the fourth pneumatic support being connected to the frame at a fourth support location.

6. The frame assembly of claim 5, wherein:
   each of a third and a fourth pneumatic support accommodates a pressure chamber; and
   the frame position control system further comprises:
      a third position sensor device configured to generate measurement data relating to a position of a third support location of the frame,
      a third pressure controller configured to control a pressure in a pressure chamber of the third pneumatic support based on the measurement data generated by the third position sensor device,
      a fourth position sensor device configured to generate measurement data relating to a position of a fourth support location of the frame, and
      a fourth pressure controller configured to control a pressure in a pressure chamber of the fourth pneumatic support based on the measurement data generated by the third position sensor device.

7. The frame assembly of claim 1, wherein the frame is a frame of the projection system, a force frame of the projection system, a frame of an illumination system, or a wafer stage metrology frame.

8. The frame assembly of claim 1, wherein the reference is a base frame or a floor onto which a lithographic apparatus is arranged, or a pedestal onto which the lithographic apparatus is arranged.

9. A frame assembly, comprising:
   a first frame,
   a first frame support comprising a first pneumatic support comprising an actuator, the first pneumatic support being arranged to control a position of the first frame relative to a first frame reference, the first pneumatic support being connected to the first frame at a first support location,
   a second frame, wherein the second frame is different from the first frame reference, the second frame being supported on the first frame by a second frame support,
   a second frame position measurement system configured to generate measurement data relating to a position of the second frame relative to the first frame, and
   a first frame position control system configured to receive the measurement data generated by the second frame position measurement system and to control the actuator of the first pneumatic support based on the measurement data.

10. The frame assembly of claim 9, wherein the first frame support further comprises:
a second pneumatic support which is connected to the first frame at a second support location,
a third pneumatic support which connected to the first frame at a third support location, and
a fourth pneumatic support which is connected to the first frame at a fourth support location,
wherein each of the pneumatic supports comprises an actuator.

11. The frame assembly of claim 10, wherein:
the second frame position measurement system is configured to generate measurement data relating to a position of a first location, a second location, a third location, and a fourth location of the second frame relative to the first frame; and
the second frame position measurement system comprises a processing system to generate a control system on the basis of at least a part of the measurement data.

12. The frame assembly of claim 8, wherein the first frame is a force frame, a projection system force frame, or a wafer stage metrology frame.

13. The frame assembly of claim 8, wherein the second frame is a sensor frame, a projection system sensor frame, or a wafer stage metrology frame.

14. The frame assembly of claim 8, wherein the first frame reference is a base frame or a floor onto which a lithographic apparatus is arranged or a pedestal onto which the lithographic apparatus is arranged.

15. A frame assembly, comprising:
a first frame,
a first frame support comprising a first pneumatic support comprising an actuator and a pressure chamber, the first pneumatic support being arranged to control a position of the first frame relative to a first frame reference, the first pneumatic support being connected to the first frame at a first support location, the first frame support further comprising a second pneumatic support, the second pneumatic support being connected to the frame at a second support location, the second pneumatic support accommodating a pressure chamber,
a second frame, wherein the second frame is different from the first frame reference, the second frame being supported on the first frame by a second frame support,
a second frame position measurement system configured to generate measurement data relating to a position of the second frame relative to the first frame,
a first frame position control system configured to receive measurement data generated by the second frame position measurement system and to control the actuator of the first pneumatic support on the basis of the measurement data, and wherein the first frame position control system further comprises:
a pressure differential sensor device configured to generate data relating to a difference between a pressure in a pressure chamber of the first pneumatic support and a pressure in a pressure chamber of the second pneumatic support, and
a second pressure controller configured to control the pressure in the pressure chamber of the second pneumatic support based on the measurement data generated by the pressure differential sensor device.

16. A frame assembly, comprising:
a first frame,
a first frame support comprising first and second pneumatic supports, the first and second pneumatic supports being arranged to control a position of the frame relative to a first frame reference, the first pneumatic support being connected to the first frame at a first support location, the second pneumatic support being connected to the first frame at a second support location, each of the pneumatic supports accommodating a pressure chamber,
a second frame, which second frame is different from the first frame reference, the second frame being supported on the first frame by a second frame support,
a second frame position measurement system configured to generate measurement data relating to a position of the second frame relative to the first frame, and
a first frame position control system configured to receive the measurement data generated by the second frame position measurement system, the first frame position control system comprising:
a first pressure controller configured to control a pressure in the pressure chamber of the first pneumatic support based on the measurement data generated by the second frame position measurement system,
a pressure differential sensor device configured to generate data relating to a difference between a pressure in the pressure chamber of the first pneumatic support and a pressure in the pressure chamber of the second pneumatic support, and
a second pressure controller configured to control the pressure in the pressure chamber of the second pneumatic support based on the measurement data generated by the pressure differential sensor device and/or based on measurement data generated by the second frame position measurement system.

17. A lithographic apparatus, comprising:
a frame,
first and second pneumatic supports, the first and second pneumatic supports being arranged to control a position of the frame relative to a reference, the first pneumatic support being connected to the frame at a first support location, the second pneumatic support being connected to the frame at a second support location, each of the pneumatic supports accommodating a pressure chamber, and
a frame position control system comprising:
a first position sensor device configured to generate measurement data relating to the position of the frame,
a first pressure controller configured to control a pressure in the pressure chamber of the first pneumatic support in response to receiving the measurement data from the first position sensor device,
a pressure differential sensor device configured to generate data relating to a difference between the pressure in the pressure chamber of the first pneumatic support and a pressure in the pressure chamber of the second pneumatic support, and
a second pressure controller configured to control the pressure in the pressure chamber of the second pneumatic support in response to receiving the measurement data from the pressure differential sensor device.

18. A lithographic apparatus, comprising:
a first frame,
a first frame support comprising a first pneumatic support comprising an actuator, the first pneumatic support being arranged to control a position of the first frame relative to a first frame reference, the first pneumatic support being connected to the first frame at a first support location, a second frame, which second frame is different from the first frame reference, the second frame being supported on the first frame by a second frame support, a second frame position measurement system configured to generate measurement data relating to a position of the second frame relative to the first frame, and a first frame position control system configured to receive measurement data generated by the second frame position measurement system and to control the actuator of the first pneumatic support based on the measurement data.

19. A lithographic apparatus, comprising:

a first frame, a first frame support comprising:
  a first pneumatic support comprising an actuator and a pressure chamber, the first pneumatic support being arranged to control a position of the first frame relative to a first frame reference, the first pneumatic support being connected to the first frame at a first support location, and
  a second pneumatic support, the second pneumatic support being connected to the frame at a second support location, the second pneumatic support accommodating a pressure chamber, a second frame, which second frame is different from the first frame reference, the second frame being supported on the first frame by a second frame support, a second frame position measurement system configured to generate measurement data relating to a position of the second frame relative to the first frame, a first frame position control system configured to receive measurement data generated by the second frame position measurement system and to control the actuator of the first pneumatic support on the basis of the measurement data, and wherein the first frame position control system further comprises:
  a pressure differential sensor device configured to generate data relating to a difference between a pressure in the pressure chamber of the first pneumatic support and a pressure in the pressure chamber of the second pneumatic support, and
  a second pressure controller configured to control the pressure in the pressure chamber of the second pneumatic support on the basis of the measurement data generated by the pressure differential sensor device.

20. A lithographic apparatus, comprising:

a first frame, a first frame support comprising a first and a second pneumatic support, the first and second pneumatic supports being arranged to control a position of the frame relative to a first frame reference, the first pneumatic support being connected to the frame at a first support location, the second pneumatic support being connected to the frame at a second support location, each of the first and second pneumatic supports accommodating a pressure chamber, a second frame, which second frame is different from the first frame reference, the second frame being supported on the first frame by a second frame support, a second frame position measurement system configured to generate measurement data relating to a position of the second frame relative to the first frame, and a first frame position control system configured to receive measurement data generated by the second frame position measurement system, the frame position control system comprising:
  a first pressure controller configured to control a pressure in the pressure chamber of the first pneumatic support based on the measurement data generated by the second frame position measurement system,
  a pressure differential sensor device configured to generate data relating to a difference between a pressure in the pressure chamber of the first pneumatic support and a pressure in the pressure chamber of the second pneumatic support, and
  a second pressure controller configured to control the pressure in the pressure chamber of the second pneumatic support based on the measurement data generated by the pressure differential sensor device and/or based on the measurement data generated by the second frame position measurement system.

* * * * *